US006539521B1

(12) United States Patent
Pierrat et al.

(10) Patent No.: US 6,539,521 B1
(45) Date of Patent: Mar. 25, 2003

(54) DISSECTION OF CORNERS IN A FABRICATION LAYOUT FOR CORRECTING PROXIMITY EFFECTS

(75) Inventors: Christophe Pierrat, Santa Clara, CA (US); Youping Zhang, Newark, CA (US)

(73) Assignee: Numerical Technologies, Inc., San Jose, CA (US)

( * ) Notice: Subject to any disclaimer, the term of this patent is extended or adjusted under 35 U.S.C. 154(b) by 61 days.

(21) Appl. No.: 09/675,582

(22) Filed: Sep. 29, 2000

(51) Int. Cl.[7] ............................................... G06F 17/50
(52) U.S. Cl. ................. 716/4; 716/19; 716/21
(58) Field of Search ............................. 716/1, 4, 2, 19, 716/20, 21; 430/4, 5, 30; 250/492.22; 382/145, 149

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 4,812,962 A | 3/1989 | Witt | |
| 5,051,598 A | 9/1991 | Ashton et al. | |
| 5,182,718 A | 1/1993 | Harafugi et al. | |
| 5,241,185 A | 8/1993 | Meiri et al. | |
| 5,538,815 A | 7/1996 | Oi et al. | |

(List continued on next page.)

FOREIGN PATENT DOCUMENTS

DE     195 45 163 A1    6/1996

(List continued on next page.)

OTHER PUBLICATIONS

Schmidt, R., et al., "Impact of Coma on CD Control for Multiphase PSM Designs", AMD, ASML (11 pages), No date.

Erdmann, A., "Topography Effects and Wave Aberrations in Advance PSM–Technology", Fraunhofer Institute of Integrated Circuits (11 pages), No date.

(List continued on next page.)

*Primary Examiner*—Matthew Smith
*Assistant Examiner*—Leigh Marie Garbowski
(74) *Attorney, Agent, or Firm*—Erik L. Oliver; Bever, Hoffman & Harms, LLP

(57) ABSTRACT

A technique for forming a fabrication layout, such as a mask layout, for a physical design layer, such as a design for an integrated circuit, includes identifying evaluation points on an edge of a polygon corresponding to the design layer for correcting proximity effects. An evaluation point is determined for the edge based on a first target length for corner segments, a second target length for non-corner segments, and characteristics of the edge. It is then determined how to correct at least a portion of the edge for proximity effects based on an analysis at the evaluation point. Another technique determines an edge type of the edge of the polygon based on the first target length for corner segments, the second target length for non-corner segments, and the characteristics of the edge. Then, the edge is divided into segments based on the edge type and the characteristics of the edge. In a technique used once a segment is determined, it is then determined whether a first end of the segment is a vertex of the polygon. If so, an evaluation point is established on the segment at a distance from the vertex that is substantially greater than half a length of the segment. A correction for the segment is then based on an analysis performed at the evaluation point.

40 Claims, 18 Drawing Sheets

U.S. PATENT DOCUMENTS

| | | |
|---|---|---|
| 5,242,770 A | 9/1993 | Chen et al. |
| 5,256,505 A | 10/1993 | Chen et al. |
| 5,302,477 A | 4/1994 | Dao et al. ..................... 430/5 |
| 5,308,741 A | 5/1994 | Kemp ....................... 430/312 |
| 5,316,878 A | 5/1994 | Saito et al. |
| 5,324,600 A | 6/1994 | Jinbo et al. ..................... 430/5 |
| 5,326,659 A | 7/1994 | Liu et al. |
| 5,328,807 A | 7/1994 | Tanaka et al. ............. 430/311 |
| 5,334,542 A | 8/1994 | Saito et al. ................... 437/40 |
| 5,340,700 A | 8/1994 | Chen et al. |
| 5,352,550 A | 10/1994 | Okamoto ...................... 430/5 |
| 5,364,716 A | 11/1994 | Nakagawa et al. ............ 430/5 |
| 5,424,154 A | 6/1995 | Borodovsky |
| 5,432,714 A | 7/1995 | Chung et al. |
| 5,447,810 A | 9/1995 | Chen et al. |
| 5,480,746 A | 1/1996 | Jinbo et al. ..................... 430/5 |
| 5,496,666 A | 3/1996 | Chu et al. ...................... 430/5 |
| 5,498,579 A | 3/1996 | Borodovsky et al. ....... 437/250 |
| 5,503,951 A | 4/1996 | Flanders et al. ............... 430/5 |
| 5,523,186 A | 6/1996 | Lin et al. ....................... 430/5 |
| 5,527,645 A | 6/1996 | Pati et al. ...................... 430/5 |
| 5,532,090 A | 7/1996 | Borodovsky .................. 430/5 |
| 5,533,148 A | 7/1996 | Sayah et al. |
| 5,537,648 A | 7/1996 | Liebmann et al. .......... 395/500 |
| 5,539,568 A | 7/1996 | Lin et al. .................... 359/285 |
| 5,553,273 A | 9/1996 | Liebmann |
| 5,565,286 A | 10/1996 | Lin ............................... 430/5 |
| 5,572,598 A | 11/1996 | Wihl et al. |
| 5,573,890 A | 11/1996 | Spence ...................... 430/311 |
| 5,595,843 A | 1/1997 | Dao .............................. 430/5 |
| 5,620,816 A | 4/1997 | Dao .............................. 430/5 |
| 5,631,110 A | 5/1997 | Shioiri et al. |
| 5,635,316 A | 6/1997 | Dao .............................. 430/5 |
| 5,636,131 A | 6/1997 | Liebmann et al. .......... 364/490 |
| 5,657,235 A | 8/1997 | Liebmann et al. |
| 5,663,893 A | 9/1997 | Wampler et al. |
| 5,682,323 A | 10/1997 | Pasch et al. ................. 364/491 |
| 5,702,848 A | 12/1997 | Spence |
| 5,705,301 A | 1/1998 | Garza et al. |
| 5,707,765 A | 1/1998 | Chen |
| 5,723,233 A | 3/1998 | Garza et al. |
| 5,725,969 A | 3/1998 | Lee ............................... 430/5 |
| 5,740,068 A | 4/1998 | Liebmann et al. |
| 5,761,075 A | 6/1998 | Oi et al. ..................... 364/488 |
| 5,766,804 A | 6/1998 | Spence .......................... 430/5 |
| 5,766,806 A | 6/1998 | Spence .......................... 430/5 |
| 5,795,688 A | 8/1998 | Burdorf et al. |
| 5,801,954 A | 9/1998 | Le et al. |
| 5,804,340 A | 9/1998 | Garza et al. |
| 5,807,649 A | 9/1998 | Liebmann et al. ............. 430/5 |
| 5,815,685 A | 9/1998 | Kamon |
| 5,825,647 A * | 10/1998 | Tsudaka ..................... 700/121 |
| 5,827,623 A | 10/1998 | Ishida et al. |
| 5,847,959 A | 12/1998 | Veneklasen et al. |
| 5,849,440 A | 12/1998 | Lucas et al. |
| 5,858,580 A | 1/1999 | Wang et al. .................... 430/5 |
| 5,863,682 A | 1/1999 | Abe et al. |
| 5,885,734 A | 3/1999 | Pierrat et al. ................... 430/5 |
| 5,923,566 A | 7/1999 | Galan et al. ................ 364/489 |
| 5,991,006 A | 11/1999 | Tsudaka ...................... 355/53 |
| 5,994,002 A | 11/1999 | Matsuoka ...................... 430/5 |
| 5,998,068 A | 12/1999 | Matsuoka ...................... 430/5 |
| 6,004,702 A | 12/1999 | Lin ............................... 430/5 |
| 6,010,807 A | 1/2000 | Lin ............................... 430/5 |
| 6,014,456 A * | 1/2000 | Tsudaka ..................... 382/144 |
| 6,057,063 A | 5/2000 | Liebmann et al. ............. 430/5 |
| 6,066,180 A | 5/2000 | Kim et al. ................... 716/19 |
| 6,077,630 A | 6/2000 | Pierrat .......................... 430/5 |
| 6,081,658 A | 6/2000 | Rieger et al. |
| 6,083,275 A | 7/2000 | Heng et al. .................. 716/19 |
| 6,228,539 B1 | 5/2001 | Wang et al. .................... 430/5 |
| 6,243,855 B1 | 6/2001 | Kobayashi et al. ........... 716/19 |
| 6,249,597 B1 | 6/2001 | Tsudaka |
| 6,249,904 B1 * | 6/2001 | Cobb .......................... 716/21 |
| 6,251,549 B1 | 6/2001 | Levenson ................... 430/11 |
| 6,258,493 B1 | 7/2001 | Wang et al. .................... 430/5 |
| 6,289,499 B1 | 9/2001 | Rieger et al. ................ 716/21 |

FOREIGN PATENT DOCUMENTS

| | | |
|---|---|---|
| EP | 0 464 492 A1 | 1/1992 |
| EP | 0 653 679 A2 | 5/1995 |
| EP | 0 698 821 | 2/1996 |
| GB | 2324169 A | 10/1998 |
| JP | 62067547 | 3/1987 |
| JP | 7-111528 | 2/1991 |
| JP | 3-80525 | 4/1991 |
| JP | 6-67403 | 3/1994 |
| JP | 8-51068 | 2/1996 |
| JP | 2650962 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 00/67074 | 11/2000 |
| WO | WO 00/67075 | 11/2000 |
| WO | WO 00/67076 | 11/2000 |

OTHER PUBLICATIONS

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SIO2 Phase Shifters", Fujitsu Laboratories, Ltd. (11 pages), No date.

Ishiwara, N., et al., "Fabrication of Phase–Shifting Mask", Fujitsu Limited (11 pages), No date.

Levenson, M., et al., "Phase Phirst! An Improved Strong–PSM Paradigm", M.D. Levenson Consulting, Petersen Advanced Lithography, KLA–Tencor (10 pages), No date.

Levenson, M., et al., "SCAA Mask Exposure and Phase Phirst Design for 110nm and Below", M.D. Levenson Consulting, Canon USA, Inc., JSR Microelectronics, Inc. (10 pages), No date.

Lin, B.J., "The Relative Importance of the Building Blocks for 193nm Optical Lithography", Linnovation, Inc. (12 pages), No date.

McCallum, M., et al., "Alternating PSM Mask Performance—a Study of Multiple Fabrication Technique Results", International SEMATECH (6 pages), No date.

Morikawa, Y., et al., "100nm–alt.PSM Structure Discussion For ArF Lithography", Dai–Nippon Printing Co., Ltd. (15 pages), No date.

Ozaki, T., et al., "A 0.15um KrF Lithography for 1Gb DRAM Product Using Highly Printable Patterns and Thin Resist Process", Toshiba Corporation (2 pages), No date.

Rhyins, P., et al., "Characterization of Quartz Etched PSM Masks for KrF Lithography at the 100nm Node", Photronics, Inc., MIT Lincoln Lab, ARCH Chemicals, Finle Technlogies, KLA Tencor Corp. (10 pages), No date.

Ronse, K., et al., "Thin Film Interference Effects in Phase Shifting Masks Causing Phase and Transmittance Errors", IMEC (15 pages), No date.

Rosenbluth, A., et al., "Optimum Mask and Source Patterns to Print a Given Shape", IBM (7 pages), No date.

Sakata, M., et al., "A Novel Radiation Sensitive Spin–on–Glass Convertible into SIO2 and the Simple Fabrication Process Using It", Oki Electric Industry Co. Ltd. (3 pages), No date.

Schmidt, R., et al., "Impact of Coma on CD Control for Multiphase PSM Designs", AMD, ASML (10 pages), No date.

Sewell, H., et al., "An Evaluation of the Dull Exposure Technique", SVG Lithography Systems Inc. (11 pages), No date.

Spence, C., et al., "Optimization of Phase–Shift Masks Designs Including Defocus Effects", AMD, Princeton University, Vecor Technologies Inc. (8 pages), No date.

Suzuki, A., et al., "Multilevel Imaging System Realizing kl=.3 Lithography", Canon Inc. (13 pages), No date.

Vandenberghe, G., et al., "(Sub–)100nm Gate Patterning Using 248nm Alternating PSM", IMEC, Mentor Graphics (9 pages), No date.

Fritze, M., et al., "100–nm Node Lithography with KrF?", MIT Lincoln Lab, Numberical Technologies, Photronics, Arch Chemicals, (14 pages), No date.

Fukuda, H., et al., "Patterning of Random Interconnect Using Double Exposure of Strong–Type PSMs", Hitachi Central Research Lab (8 pages), No date.

Ferguson, R., et al., "Pattern–Dependent Correction of Mask Topography Effects for Alternating Phase–Shifting Masks", IBM Microelectronics, University of California Berkeley (12 pages), No date.

Toublan, O., et al., "Phase and Transmission Errors Aware OPC Solution for PSM: Feasibility Demonstration", Mentor Graphics Corp. (7 pages), No date.

Yanagishita, Y., et al., "Phase–Shifting Photolithography Applicable to Real IC Patterns", Fujitsu Limited (11 pages), No date.

Levenson, M., et al., "The Phase–Shifting Mask II: Imaging Simulations and Submicrometer Resist Exposures," IEEE Transactions on Electron Devices, vol. ED–31, No. 6, pp. 753–763, Jun. 1984.

IBM, "Method to Produce Sizes in Openings In Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64nm DRAM with 1–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase–Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part I: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase–Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 43, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al,. "Phase–Shifting Lithography: Maskmaking and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Characteristics of Materials for Phase–Shifting Masks", Applied Optics, vol. 34, No. 22, pp. 4923–4928, Aug. 1, 1995.

Galan, G., et al., "Alternating Phase shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Heirarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Heirarchical Processing of Levenson–Type Phase Shifter Generation", Jpn. J. Appl. Phys., vol. 36, Part I, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages), No date.

Petersen, J., et al., "Designing Dual–Trench Phase–Shift Masks for 140nm and Smaller Features Using 248–um KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages), No date.

Ackmann, P. et al., "Phase Shifting And Optical Proximity Corrections To Improve CD Control On Logic Devices In Manufacturing For Sub 0.35 $\mu$m I–Line", Advance Micro Devices (8 pages), No date.

Asai, S. et al., "High Performance Optical Lithography Using a Separated Light Source", J. Vac. Sci. Technol. B, vol. 10, No. 6, pp. 3023–3026, Nov./Dec. 1992.

Barouch, E. et al., "OPTIMASK: An OPC Algorithm For Chrome And Phase–Shift Mask Design", SPIE, vol. 2440, pp. 192–206, Feb. 1995.

Brunner, T. et al., "170nm Gates Fabricated By Phase–Shift Mask And Top Anti–Reflector Process", SPIE, Optical/Laser Microlithography VI, vol. 1927, pp. 182–189 (1993).

Fukuda, H. et al., "Determination Of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path To Below 0.3 $\mu$m Pitch, Proximity Effect Free, Random Interconnects And Memory Patterning", J. Vac. Sci. Technol. B, vol. 17, No. 6, pp. 3291–3295, Nov./Dec. 1999.

Galan, G. et al., "Application Of Alternating–Type Phase Shift Mask To Polysilicon Level for Random Logic Circuits", Jpn. J. Appl. Phys., vol. 33, pp. 6779–6784 (1994).

Inokuchi, K. et al., "Sub–Quarter Micron Gate Fabrication Process Using Phase–Shifting–Mask for Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", Japanese Journal of Applied Physics, vol. 30, No. 12B, pp. 3818–3821, Dec. 1991.

Levenson, M. et al., "Improving Resolution In Photolithography With A Phase–Shifting Mask", IEEE Transactions on Electron Devices, vol. ED–29, No. 12, pp. 1828–1836, Dec. 1982.

Lin, B.J., "Phase–Shifting Masks Gain An Edge", IEEE Circuits & Devices, pp. 28–35, Mar. 1993.

Liu, H.Y. et al., "Fabrication of 0.1 $\mu$m T–Shaped Gates By Phase–Shifting Optical Lithography", SPIE, Optical/Laser Microlithography VI, vol. 1927, pp. 42–52 (1993).

Matsuoka, K. et al., "Application Of Alternating Phase–Shifting Mask To 0.16 $\mu$m CMOS Logic Gate Patterns", Matsushita Electric Ind. Co., Ltd. (9 pages), No date.

Minzuno, F. et al., "Practical Phase–Shifting Mask Technology For 0.3 $\mu$m Large Scale Integrations", J. Vac. Sci. Technol. B, vol. 12, No. 6, pp. 3799–3803, Nov./Dec. 1994.

Neureuther, A., "Modeling Phase Shifting Masks", SPIE, $10^{th}$ Annual Symposium on Microlithography, vol. 1496, pp. 80–85 (1990).

Pierrat, C. et al., "A Rule–Based Approach To E–Beam And Process–Induced Proximity Effect Correction For Phase–Shifting Mask Fabrication", SPIE, vol. 2194, pp. 298–309 (1994).

Pierrat, C. et al., "Phase–Shifting Mask Topography Effects On Lithographic Image Quality", IEEE, pp. 3.3.1–3.3.4 (1992).

Spence, C. et al., "Integration Of Optical Proximity Correction Strategies In Strong Phase Shifters Design For Poly–Gate Layers", Bacus News, vol. 15, Issue 12, pp. 1, 4–13, Dec. 1999.

Terasawa, T. et al., "0.3–Micron Optical Lithography Using A Phase–Shifting Mask", SPIE, Optical/Laser Microlithography II, vol. 1088, pp. 25–33, Mar. 1989.

Lucas, K., et al., "Model Based OPC for 1st Generation 193nm Lithography", Motorola Inc., IDT assignee to IMEC (12 pages), No date.*

Stirniman, J., et al., "Quantifying Proximity and Related Effects in Advanced Wafer Processes", Precrim Company, Hewlett Packard Labs (9 pages), No date.*

Sugawara, M., et al., "Practical Evaluation of Optical Proximity Effect Correction by EDM Methodology", Sony Corporation (11 pages), No date.*

Saleh, B., et al., "Reduction of Errors of Microphotographic Reproductions by Optimal Corrections of Original Masks", Optical Engineering, vol. 20, No. 5, pp. 781–784, Sep./Oct. 1981.*

Fu, C.C., et al., "Enhancement of Lithographic Patterns by Using Serif Features", IEEE, Transactions On Electron Devices, vol. 38, No. 12, pp. 2599–2603, Dec. 1991.*

Harafuji, K., et al., "A Novel Hierarchical Approach for Proximity Effect Correction in Electron Beam Lithography", IEEE, vol. 12 No. 10, pp. 1508–1514, Oct. 1993.*

Henderson, R., et al., "Optical Proximity Effect Correction: An Emerging Technology", Microlithography World, pp. 6–12 (1994).*

Dolainsky, C., et al., "Application of a Simple Resist Model to Fast Optical Proximity Correction", SPIE, vol. 3051, pp. 774–780 (1997).*

Chuang, H., et al., "Practical Applications of 2–D Optical Proximity Corrections for Enhanced Performance of 0.25um Random Logic Devices", IEEE, pp. 18.7.1–18.7.4, Dec. 1997.*

Asai, N., et al., "Proposal for the Coma Aberration Dependent Overlay Error Compensation Technology", Jpn. J. Appl. Phys., vol. 37, pp. 6718–6722 (1998).*

Barouch, E., et al., "OPTIMASK: An OPC Algorithm for Chrome and Phase–Shift Mask Design", 2/22–24/95, SPIE vol. 2440, pp. 192–206.

Brunner, T., et al., "Approximate Models for Resist Processing Effects", 198/SPIE vol. 2726, Optical Microlithography IX Mar. 13–15, 1996, pp. 198–209.

Brunner, T, "Rim Phase–Shift Mask Combined with Off–Axis Illumination: A Path to 0.5λ/Numerical Aperture Geometries", Optical Engineering, Oct. 1993, vol. 32, No. 10, pp. 2337–2343.

Casey, J. Jr., et al., "Chemically Enhanced FIB Repair of Opaque Defects on Molybdenum Silicide Photomasks", Wednesday Poster Session Paper 3236–58, Photomask Technology and Management Technical Program, (1997), SPIE, vol. 3236, pp. 487–497.

Chang, K., et al., "Accurate Modeling of Deep Submicron Interconnect Technology", TMA Times, Fall 1997 vol. IX, No. 3, No pages.

Cobb, et al., "Fast Sparse Aerial Image Calculation for OPC", SPIE vol. 2621, pp. 534–544, No date.

Gans, F., et al., "Printability and Repair Techniques for DUV Photomasks", Photomask Technology and Management Technical Program, Session 3 Paper, (1998), pp. 136–141.

Ham, Y. M., et al., "Dependence of Defects in Optical Lithography", Jpn. J. Appl. Phys. vol. 31 (1992), pp. 4137–4142.

Henke, W., et al., "A Study of Reticle Defects Imaged Into Three–Dimensional Developed Profiles of Positive Photresist Using the SOLID Lithography Simulator", Microelectronic Engineering 14 (1991) 283–297.

Ibsen, K., et al., "Clear Field Reticle Defect Disposition for Advanced Sub–Half Micron Lithography", (1997), Photomask Technology and Management Technical Program, Session 3 Paper 3236–13.

Ishiwata, N., et al., "Novel Alternating Phase Shift Mask with Improved Phase Accuracy", Photomask Technology and Management Technical Program, Session 7 Paper 3236–28, SPIE vol. 3236, No date.

Jinbo, H., et al., "0.2 μm OR Less i–Line Lithography by Phase–Shifting–Mask Technology", Semiconductor Technology Lab., Oki Electric Industry Co., Ltd., CH2865–4/90/0000–0825, pp. 33.3.1–33.3.4.

Jinbo, H., et al., "Application of Blind Method to Phase–Shifting Lithography", 1992 Symposium on VLSI Technology Digest of Technical Papers, pp. 112–113.

Jinbo, H., "Improvement of Phase–Shifter Edge Line Mask Method", Japanese Journal of Applied Physics, vol. 30, No. 11B, Nov., 1991, pp. 2998–3003.

Karklin, Linard, "A Comprehensive Simulation Study of the Photomask Defects Printability", SPIE vol. 2621, pp. 490–504.

Kimura, T., et al., "Sub–Micron Gate GaAs Mesfet Process Using Phase–Shifting–Mask Technology", GaAs IC Symposium, 1991, pp. 281–284.

Lithas: Optical Proximity Correction Software, No date, No pages.

MicroUnity: OPC Technology & Product Description, pp. 1–5, No date.

Morimoto, H., et al., "Next Generation Mask Strategy–Technologies are Ready for Mass Production of 256MDRAM?", (Panel discussion of PMJ'97 on Apr. 18, 1997), SPIE vol. 3236 pp. 188–189.

Nistler, J., et al., "Large Areas Optical Design Rule Checker for Logic PSM Application", SPIE vol. 2254 Photomask and X–ray Mask Technology (1994), pp. 78–92.

Nistler, J., et al., "Phase Shift Mask Defect Printability Analysis", Eytan Barouch and Uwe Hollerback, Princeton University, Princeton, NJ, pp. 11–27, No date.

Ohtsuka, H., et al., "Phase Defect Repair Method for Alternating Phase Shift Masks Conjugate Twin–Shifter Method", Jpn. J. Appl. Phys. vol. 31, Part 1, No. 12B, (1992) pp. 4143–4149.

Park, C., et al., "An Automatic Gate CD Control for a Full Chip Scale SRAM Device", CAE, Process Development Team, Semiconductor R&D Center, Samsung Electronics Co., Ltd, SPIE vol. 3236, (1997), pp. 350–356.

Pati, Y.C., et al., "Exploiting Structure in Fast Aerial Image Computation for Integrated Circuit Patterns", IEEE Transactions on Semiconductor Manufacturing, vol. 10, No. 1, Feb. 1997, pp. 62–64.

Pati, Y.C., et al., "Phase–Shifting Masks for Microlithography: Automated Design and Mask Requirements," J. Opt. Soc. Am. A/vol. 11, No. 9/Sep. 1994, pp. 2438–2452.

"Proxima System," Precim Company, Portland, Oregon (2 pages), No date.

"Proxima Wafer Proximity Correction System", Precim Company, Portland, Oregon (2 pages), No date.

Reiger, M., et al., "Customizing Proximity Correction for Process–Specific Objectives", Precim Company, (1996), SPIE vol. 2726, pp. 651–659.

Rieger, M., et al., "Mask Fabrication Rules for Proximity–Corrected Patterns", Precim Company, Portland, Oregon, No date, No pages.

Rieger, M., et al., "Proxima System Theory of Operation", Aug. 23, 1993, pp. 1–20.

Rieger, M., et al., "V–Domain Definition", Sep. 8, 1993, pp. 1–7.

Rieger, M., et al., "Using Behavior Modelling for Proximity Correction", Precim Company, SPIE 1994, No pages.

Roman, B., et al., "Implications of Device Processing on Photomask CD Requirements", (Motorola Advanced Products Research and Development Laboratory, Austin, TX 78762), Photomask Technology and Management Technical Program, Session 8, Paper 3236–31, p. 51.

Spence, C., et al., "Automated Determination of CAD Layout Failures Through Focus: Experimental and Simulation", SPIE vol. 2197, (1994), pp. 302–313.

Spence, C., et al., "Detection of 60° Phase Defects on Alternating PSMs", Advanced Micro Devices, KLA–Tencor DuPoint TRC, No date, No pages.

Stirniman, J., et al., "Fast Proximity Correction with Zone Sampling", SPIE vol. 2197 (1994), pp. 294–301.

Stirniman, J., et al., "Optimizing Proximity Correction for Wafer Fabrication Processes", SPIE vol. 2322, Photomask Technology and Management (1994), pp. 239–246.

Stirniman, J., et al., "Spatial Filter Models to Describe IC Lithographic Behavior", Precim Corporation, Portland, Oregon, No date, No pages.

Stirniman, J., et al., "Wafer Proximity Correction and Its Impact on Mask–Making", Bacus News, Photomask, Jan. 1994, vol. 10, Issue 1, p. 1, 3–7, 10–12.

Sugawara, M., et al., "Defect Printability Study of Attenuated Phase–Shifting Masks for Specifying Inspection Sensitivity", Semiconductor Company, Sony Corporation, Kanagawa, Japan, No date, No pages.

Trans Vector Technologies, Inc: "Now Better Quality Photomasks", OPRX, 4 pages, No date.

Vacca, A., et al., "100nm Defect Detection Using a Dynamically Programmable Image Processing Algorithm", Photomask Technology and Management Technical Program, Session 6 Paper 3236–24, No date.

Vacca, A., et al., "100nm Defect Detection Using an Existing Image Acquisition System", (1998), SPIE vol. 3236, pp. 208–214.

Watanabe, H., et al., "Detection and Printability of Shifter Defects in Phase–Shifting Masks II. Defocus Characteristics", Jpn. J. Appl. Phys. vol. 31 (1992) Pt. 1, No. 12B, pp. 4155–4160.

Wiley, J., et al., "Device Yield and Reliability by Specification of Mask Defects", SolidState Technology, Lithography, No date, No pages.

Wiley, J., et al., "The Effect of Off–Axis Illumination on the Printability of Opaque and Transparent Reticle Defects", SPIE vol. 2512, (1995), pp. 432–440.

Wiley, J., et al., "Phase Shift Mask Pattern Accuracy Requirements and Inspection Technology", SPIE vol. 1464 Integrated Circuit Metrology, Inspection and Process Control V (1991), pp. 346–355.

Yen, A., et al., "Characterization and Correction of Optical Proximity Effects in Deep–Ultraviolet Lithography Using Behavioral Modeling", J. Vac. Sci. Technol. B 14(6), Nov./Dec. 1996, pp. 4175–4178.

* cited by examiner

DISSECTION OF CORNERS IN A FABRICATION LAYOUT FOR CORRECTING PROXIMITY EFFECTS

RELATED APPLICATIONS

This application is related to U.S. patent application Ser. No. 09/675,197 entitled "Dissection Of Edges With Projection Points In A Fabrication Layout For Correcting Proximity Effects," filed on Sep. 29, 2000, invented by Christophe Pierrat and Youping Zhang.

This application is related to U.S. patent application Ser. No. 09/676,375 entitled "Dissection Of Printed Edges From A Fabrication Layout For Correcting Proximity Effects," filed on Sep. 29, 2000, invented by Christophe Pierrat and Youping Zhang.

This application is related to U.S. patent application Ser. No. 09/676,356 entitled "Selection Of Evaluation Point Locations Based on Proximity Effects Model Amplitudes For Correcting Proximity Effects In A Fabrication Layout," filed on Sep. 29, 2000, invented by Christophe Pierrat and Youping Zhang.

This application is related to U.S. patent application Ser. No. 09/728,885 entitled "Displacing Edge Segments On A Fabrication Layout Based on Proximity Effects Model Amplitudes For Correcting Proximity Effects," filed on Dec. 1, 2000, invented by Christophe Pierrat and Youping Zhang.

This application is related to U.S. patent application Ser. No. 09/130,996, entitled "Visual Inspection and Verification System," filed on Aug. 7, 1998.

This application is related to U.S. patent application Ser. No. 09/153,783, entitled "Design Rule Checking System and Method," filed on Sep. 16, 1998.

This application is related to U.S. patent application Ser. No. 09/544,798, entitled "Method and Apparatus for a Network Based Mask Defect Printability Analysis System," filed on Apr. 7, 2000.

This application is related to U.S. patent application Ser. No. 09/154,415, entitled "Data Hierarchy Layout Correction and Verification Method and Apparatus," filed on Sep. 16, 1998.

This application is related to U.S. patent application Ser. No. 09/154,397, entitled "Method and Apparatus for Data Hierarchy Maintenance in a System for Mask Description," filed on Sep. 16, 1998.

This application is related to U.S. patent application Ser. No. 09/632,080, entitled "General Purpose Shape-Based Layout Processing Scheme for IC Layout Modifications," filed on Aug. 2, 2000.

BACKGROUND OF THE INVENTION

1. The Field of the Invention

This invention relates to the field of printed feature manufacturing, such as integrated circuit manufacturing. In particular, this invention relates to automatically identifying evaluation points where errors are computed and analyzed to achieve improved agreement between a design layout and an actual printed feature.

2. Description of Related Art

To fabricate an integrated circuit (IC), engineers first use a logical electronic design automation (EDA) tool, also called a functional EDA tool, to create a schematic design, such as a schematic circuit design consisting of symbols representing individual devices coupled together to perform a certain function or set of functions. Such tools are available from CADENCE DESIGN SYSTEMS and from SYNOPSYS. The schematic design must be translated into a representation of the actual physical arrangement of materials upon completion, called a design layout. The design layout uses a physical EDA tool, such as those available from CADENCE and AVANT!. If materials must be arranged in multiple layers, as is typical for an IC, the design layout includes several design layers.

After the arrangement of materials by layer is designed, a fabrication process is used to actually form material on each layer. That process includes a photo-lithographic process using a mask having opaque and transparent regions that causes light to fall on photosensitive material in a desired pattern. After light is shined through the mask onto the photosensitive material, the light-sensitive material is subjected to a developing process to remove those portions exposed to light (or, alternatively, remove those portions not exposed to light). Etching, deposition, diffusion, or some other material altering process is then performed on the patterned layer until a particular material is formed with the desired pattern in the particular layer. The result of the process is some arrangement of material in each of one or more layers, here called printed features layers.

Because of the characteristics of light in photolithographic equipment, and because of the properties of the material altering processes employed, the pattern of transparent and opaque areas on the mask is not the same as the pattern of materials on the printed layer. A mask design process is used, therefore, after the physical EDA process and before the fabrication process, to generate one or more mask layouts that differ from the design layers. When formed into one or more masks and used in a set of photolithographic processes and material altering processes, these mask layouts produce a printed features layer as close as possible to the design layer.

The particular size of a feature that a design calls for is the feature's critical dimension. The resolution for the fabrication process corresponds to the minimum sized feature that the photolithographic process and the material processes can repeatably form on a substrate, such as a silicon wafer. As the critical dimensions of the features on the design layers become smaller and approach the resolution of the fabrication process, the consistency between the mask and the printed features layer is significantly reduced. Specifically, it is observed that differences in the pattern of printed features from the mask depend upon the size and shape of the features on the mask and the proximity of the features to one another on the mask. Such differences are called proximity effects.

Some causes of proximity effects are optical proximity effects, such as diffraction of light through the apertures of the optical systems and the patterns of circuits that resemble optical gratings. Optical proximity effects also include underexposure of concave corners (inside corners with interior angles greater than 180 degrees) and overexposure of convex corners (outside corners with interior angles less than 180 degrees), where the polygon represents opaque regions, and different exposures of small features compared to large features projected from the same mask. Other causes of proximity effects are non-optical proximity effects, such as sensitivity of feature size and shape to angle of attack from etching plasmas or deposition by sputtering during the material altering processes, which cause features to have shapes and sizes that have decayed from or accumulated onto their designed shapes and sizes.

In attempts to compensate for proximity effects, the mask layouts can be modified. To illustrate, FIG. 1A shows mask items 170, such as windows or opaque areas on a mask, represented by edges 171 on one or more polygons, and some printed features 180 with exaggerated proximity effects. FIG. 1A does not represent an actual example, but is provided simply to illustrate the concepts of proximity effects and mask modifications to attempt to correct for proximity effects. To make apparent the illustrated proximity effects, the projection of the original polygons 171 is shown as a fine line around the printed features 180. Note that the printed features 180 includes a spurious connection feature 182, an edge 185 entirely displaced inside the corresponding edge of the original outline 171, and an end line 183 completely inside the outline of the original items 171.

FIG. 1B illustrates various ways mask items 190 are modified to correct for such effects. FIG. 1B is not a particular example of a particular set of corrections that actually mitigate the proximity effects illustrated in FIG. 1A. The corrections available include hammerheads 192 (i.e. hammerheads 192*a* and 192*b*) added to ends of items to compensate for overexposure of the entire end line of a feature. Also shown are biases 196 (i.e. biases 196*a* and 196*b*) applied along portions of a straight edge of a feature. A negative bias like 196 represents a portion of an opaque area made transparent (or a portion of a window made opaque). In this case the negative bias reduces the size of the item on a mask to avoid generating the spurious feature 182 of FIG. 1A. Also shown are assist features 194 (i.e. assist features 194*a* and 194*b*), which are separate items smaller than the resolution of the photolithographic process and thus too small to be formed in a photoresist layer, but which are sufficiently large to effect diffraction patterns that influence larger nearby features. The assist features 194 are intended to move the edge 185 of the printed features 180 in FIG. 1A toward the outline 171 of the original mask items 170. Also shown is a sub-resolution serif 193 of extra opaque material to compensate for overexposure at convex corners of opaque areas, and an anti-serif 197 indicating where opaque material, if any, is removed to compensate for underexposure at concave corners of opaque polygons. These corrections are listed to illustrate the concepts of correcting a mask to compensate for proximity effects. The illustrated corrections do not necessarily correct the depicted features.

In rule-based proximity corrections, corrections such as the serifs and biases of a predetermined size are automatically placed at corners and edges of fabrication layout shapes like the mask shapes 170. Other rules may include adding assist shapes to a mask near desired features from the design layout and adding hammerheads to short end lines of the desired features. Experience of engineers accumulated through trial and error can be expressed as rules, and applied during the fabrication design process. For example, a rule may be expressed as follows: if a feature is isolated, then widen the opaque region in the mask by a particular amount to compensate for expected overexposure, so that the feature prints properly.

The experience captured in rule-based corrections is garnered by going through the fabrication process repeatedly with different mask layouts, making adjustments and observing the results. However, this process consumes time and manufacturing capacity. Even if such experimental, rule-forming runs are made, the resulting rules often do not give satisfactory results as the features become more complicated, or become smaller, or interact in more confined areas, or involve any combination of these effects.

Because rule based corrections are often imprecise and time consuming to revise and test, a proximity effects model is often developed and used to predict the effects of a change in the mask layout with more precision and with fewer off line fabrication runs.

A proximity effects model is typically built for a particular suite of equipment and equipment settings assembled to perform the fabrication process. The model is often built by performing the fabrication process one or a few times with test patterns on one or more mask layouts, observing the actual features printed (for example with a scanning electron micrograph), and fitting a set of equations or matrix transformations that most nearly reproduce the locations of edges of features actually printed as output when the test pattern is provided as input. The output of the proximity effects model is often expressed as an optical intensity. Other proximity effects models provide a calibrated output that includes a variable threshold as well as an optical intensity. Some proximity effects models provide a calibrated output which indicates a printed edge location relative to a particular optical intensity as a spatial deviation. Thus some model outputs can take on values that vary practically continuously between some minimum value and some maximum value.

Once a proximity effects model is produced, it can be used in the fabrication design process. For example, the proximity effects model is run with a proposed mask layout to produce a predicted printed features layer. The predicted printed features layer is compared to the design layer and the differences are analyzed. Based on the differences, modifications to the proposed mask layout are made, such as by adding or removing serifs 193, or adding or removing anti-serifs 197. After making these corrections to the proposed mask layout, a final mask layout is generated that is used in the fabrication process.

A proximity effects model typically produces predictions that lead to corrections that are more accurate than rule based corrections. However, a proximity effects model consumes computational resources by an amount that is related to the number of points of interest where amplitudes are computed. For typical mask layouts, the number of points where the model could be run is large, and the computation time is prohibitive. Therefore it is typical to run the proximity effects model at selected evaluation points located on the edges of features, to determine the correction needed, if any, at each evaluation point, and then to apply that correction to all the points on a segment of the edge in the vicinity of the evaluation point.

If too many evaluation points are selected, the model runs too slowly and the correction procedure takes too long. If too few evaluation points are selected, the model may not detect critical locations where corrections are necessary. Another undesirable effect of too few evaluation points is that segments can become too large, so that even if a correction is accurate for the evaluation point, the correction is applied to too much of the edge. This causes undesirable changes on the edge away from the evaluation point.

What are needed are new ways to select evaluation points and define their vicinity for the mask layouts, so that a reasonable number of comparisons can be made and so that effective modifications to the mask layouts can be suggested.

SUMMARY OF THE INVENTION

According to techniques of the present invention, edges of polygons in a mask layout are dissected into segments defined by dissection points, with each segment having an evaluation point, according to modified dissection rules. These techniques allow the spacing of evaluation points and dissection points to be automatically adapted to portions of each edge where changes in the proposed mask layout are most likely needed. According to these techniques, dissection points are closer together where proximity effects are more significant and are farther apart where proximity effects are less significant. Thus unnecessary evaluation points are eliminated and the analysis process is speeded up, while still retaining needed evaluation points.

In one aspect of these techniques, all dissection points can be derived from just a few easily defined parameters. The first parameter is a corner dissection segment length, Lcor, used as a target length to compute dissection points for corner segments that include at least one vertex of the polygon when the length of the edge allows. The second parameter is a detail dissection segment length, Ldet, used as a target length to derive dissection points for segments along portions of an edge where changes in proximity effects are expected to be significant, such as adjacent to corner segments and around projection points when the length of the edge allows. A projection point is a location on an edge where a vertex of another edge comes close enough to introduce sharp changes in the proximity effects. A halo distance is a parameter that determines whether a vertex is close enough to introduce an important effect. A maximum dissection segment length, Lmax, by definition larger than either Lcor or Ldet, is used as a target length to further dissect long portions of the edge that would otherwise not be dissected, such as away from corners and projections points. Extra precision is achieved if a true-gate extension length parameter Lext is used on edges of shifters forming true-gates. The dissection parameters Lcor, Ldet, Lmax, halo and Lext are pre-set and accessed as needed.

In one aspect of the disclosed techniques, a profile of amplitudes from a proximity effects model along an edge of a feature in a design layout is used to dissect the edge. This amplitude profile reflects the level of proximity effects for the given layout and fabrication process. By using this information, a better dissection of the edge is achieved in which the segment length between successive dissection points depends on the magnitude of the proximity effects. For example, on a portion of an edge where the magnitude of the proximity effects is larger than another portion, the segment length is made longer. This kind of dissection avoids making the segment length too short. A segment that is too short, for example in a corner, may result in a very large correction, and may prevent the overall corrections for the layout from converging.

In another aspect, the dissection parameters are derived from the segment lengths based on profiles of amplitudes. According to the modified dissection rules, each evaluation point is placed along a segment at a predetermined fraction of the distance from one dissection point to the other defining each segment, where the predetermined fraction depends on the type of segment. For example, an evaluation point is placed closer to the non-vertex dissection point in a corner segment; and is placed midway between dissection points in other types of segments. Also according to the modified dissection rules, segments are located on polygon edges according to the type of edge, such as whether the edge is a line end, a turn end, or a longer edge. These edge types are deduced from the length of the edge compared to the dissection parameters and whether one or both vertices of the edge are concave or convex corners.

Specifically, according to some aspects of the invention, techniques for correcting a segment on an edge of a polygon in a layout for proximity effects include determining that a first end of the segment is a vertex of the polygon. If so, then an evaluation point is established on the segment at a distance from the vertex that is substantially greater than half a length of the segment. Then a correction is determined for the segment based on an analysis performed at the evaluation point.

According to other aspects, techniques for correcting proximity effects associated with an edge of a polygon corresponding to a design layout include determining an edge type of the edge of the polygon based on a first target length for corner segments, a second target length for non-corner segments, and characteristics of the edge. Then the edge is divided into segments based on the edge type and the characteristics of the edge. It is then determined how to correct the edge for proximity effects based on the segments.

According to other aspects, techniques for correcting proximity effects associated with an edge of a polygon corresponding to a layout include determining an evaluation point for the edge based on a first target length for corner segments, a second target length for non-corner segments, and characteristics of the edge. It is then determined how to correct at least a portion of the edge for proximity effects based on an analysis at the evaluation point.

According to one embodiment of this aspect of the invention, determining the evaluation point includes determining whether an edge length of the edge is greater than or equal to a sum of the second target length and double the first target length. If so, then a first two evaluation points are established on the edge. Each of these two evaluation points is established on a respective corner segment. Each corner segment includes one vertex of the edge and has a corner segment length equal to the first target length.

According to another of these embodiments, if it is determined that the edge length is greater than or equal to the sum, then a residual edge is established as a portion of the edge between both of the respective corner segments. It is then determined whether the residual edge includes a projection point. A projection point is a point on a residual edge closest to a vertex of an other edge which is within a halo distance of the residual edge. If it is determined the residual edge does not include a projection point, then the residual edge is split into one or more equal length segments. Each of these segments has a length no less than the smaller of the first target length and the second target length. One evaluation point is then established on each of these segments.

According to another of these embodiments, if it is determined the residual edge does include a projection point, then a projection point segment is established. The projection point segment includes the projection point and has a length no less than the second target length. One evaluation point is then established on the projection point segment According to a different embodiment, a computer system for correcting proximity effects includes a computer readable medium carrying data representing the edge, a first target length for corner segments, a second target length for non-corner segments, and at least a portion of the layout. The layout corresponds to a portion of an integrated circuit. The computer system includes one or more processors coupled to the computer readable medium. The processors are configured to determining an evaluation point for the edge based on the first target length, the second target length and characteristics of the edge. The processors also execute a routine implementing a proximity effects model for the evaluation point to produce a model amplitude. A correction for at least a portion of the edge corresponding to the evaluation point is determined based on an analysis of the model amplitude. The correction is then applied to the portion of the edge.

In another embodiment, a mask for fabricating a printed features layer includes an opaque region having a segment corrected for proximity effects. The segment corresponds to at least one portion of an edge in a design layer for the printed features layer. The segment is displaced from the corresponding portion in the design layer by a correction distance. The correction distance is based on analysis of an amplitude output by a proximity effects model at an evaluation point on the corresponding portion of the edge. The evaluation point is based on the first target length for corner segments, the second target length for non-corner segments, and the characteristics of the edge.

According to other aspects of the invention, techniques for correcting proximity effects associated with an edge of a polygon corresponding to a layout include determining whether to establish an evaluation point for the edge based on a first target length for corner segments, a second target length for non-corner segments, and characteristics of the edge. If it is determined to establish an evaluation point, then the evaluation point is established and it is determined how to correct at least a portion of the edge for proximity effects based on an analysis at the evaluation point.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

Figure 1A:
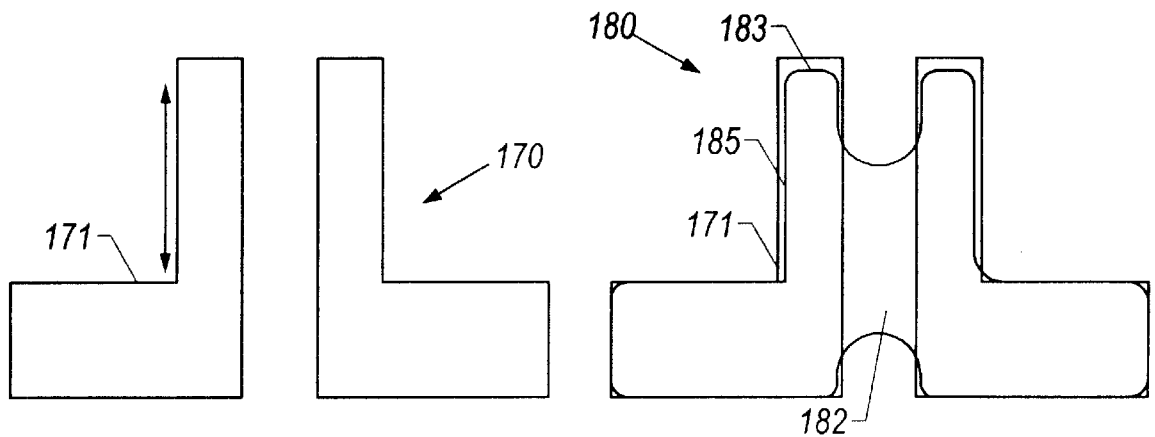
FIG. 1A is a plan view of two items on a mask and the resulting printed features showing proximity effects.
Figure 1B:
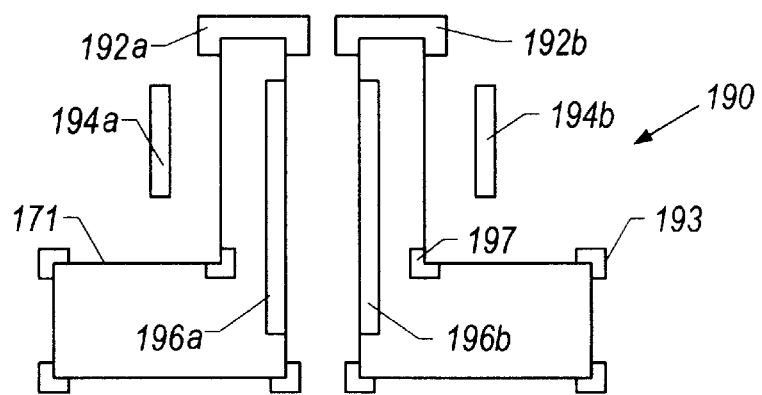
FIG. 1B is a plan view of elements on a modified mask after adjusting the mask of FIG. 1A in an attempt to correct for proximity effects.
Figure 2:
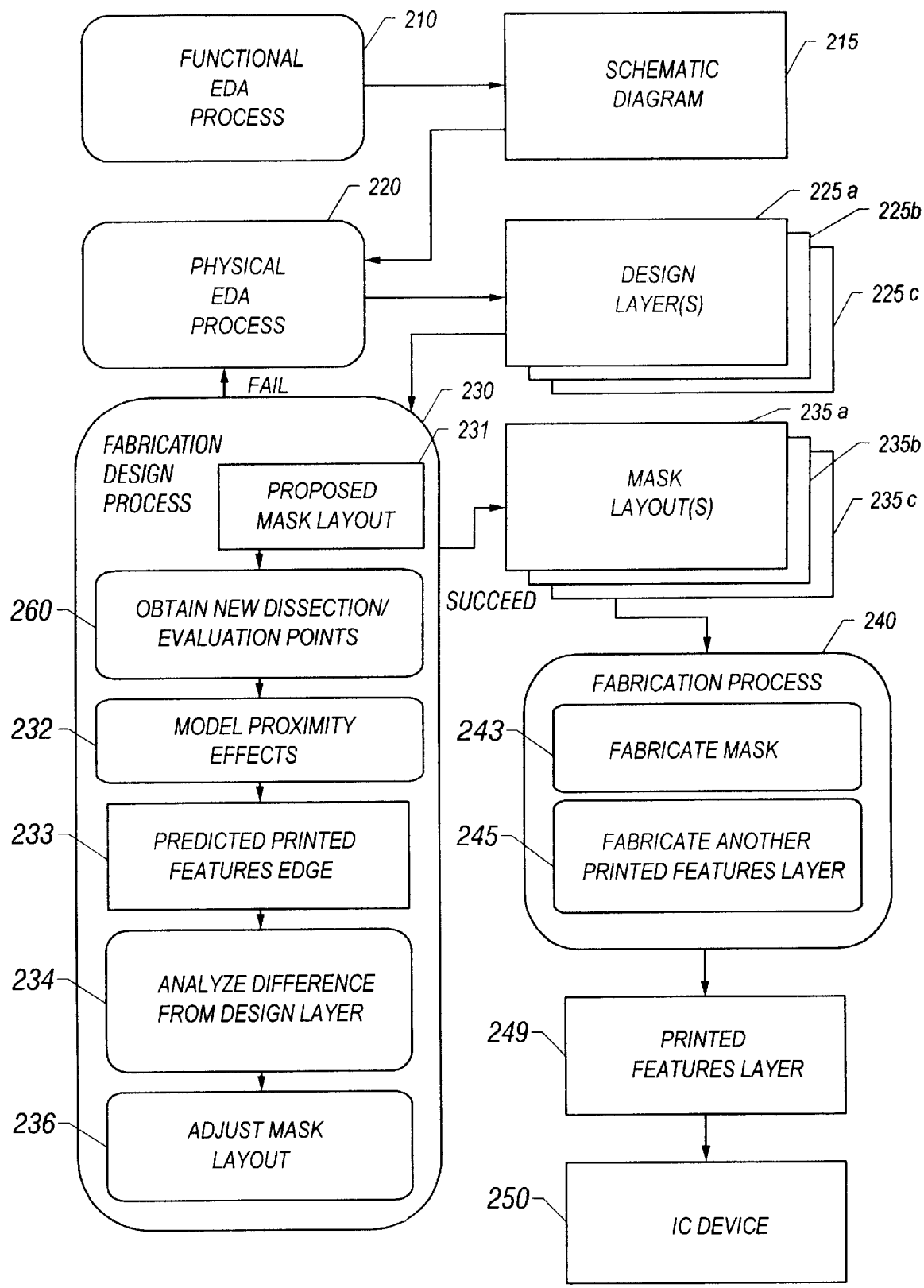
FIG. 2 is a flow chart showing the sequence of processes and layouts utilized in the formation of devices having printed features layers according to one embodiment of the disclosed techniques.

Techniques are described for correcting fabrication layouts for proximity effects during the fabrication of printed features layers, such as in integrated circuits.
Functional Overview FIG. 2 shows the processes and layouts produced according to the present techniques for designing and fabricating printed features layers 249 for devices 250. The conventional processes are modified to include new techniques for selecting evaluation and dissection points, as represented in FIG. 2 by process 260.

The conventional processes include the Functional EDA process 210 that produces the schematic diagram 215. The physical EDA process 220 converts the schematic diagram to a design layout made up of one or more design layers 225 (e.g. design layers 225a, 225b, and 225c). After mask layouts 235 (e.g. mask layouts 235a, 235b, and 235c) are produced, the conventional processes employ a fabrication process 240 to produce the printed features layer 249. The printed features layer 249 may be a layer in a printed circuit or the mask used to produce the layer in the printed circuit. In the former case, the fabrication process includes one process 243 for forming the mask and a second process 245 to produce the layer of the integrated circuit using the mask. If the printed features layer 249 is the mask, step 245 is skipped.

According to techniques of the present invention, the fabrication design process 230 includes a new process 260 for obtaining dissection and evaluation points. In one embodiment, these new dissection and evaluation points are determined for a proposed mask layout 231 and used with a proximity effects model in step 232 to produce a model output 233. The model output is related to the predicted location of edges in the printed features layer if a printed features layer were fabricated with a mask having the proposed mask layout. Hence, in FIG. 2, the model output is called the predicted printed features edge.

Each evaluation point is established for a segment of an edge from the proposed mask layout. The segment is defined by a pair of dissection points associated with the evaluation point. Once the dissection points and evaluation points are selected, the proximity effects model is run at the evaluation points. In step 234, the predicted printed features edge 233 for the evaluation point is compared to a target position for that edge in the design layer. Based on an analysis of the comparison, a correction distance is computed. The correction distance is then applied to the entire segment between dissection points associated with the evaluation point on the edge of the affected polygon. As each correction is applied, the mask layout is adjusted in step 236. As a result of the adjustments in step 236 the polygons on the adjusted mask layout may differ from the polygons in the proposed mask layout, as well as from the polygons in the design layers 225. The final mask layouts 235 are then based on the adjusted mask layouts produced by the adjustment process 236.

Obtaining Dissection and Evaluation Points

Figure 3:
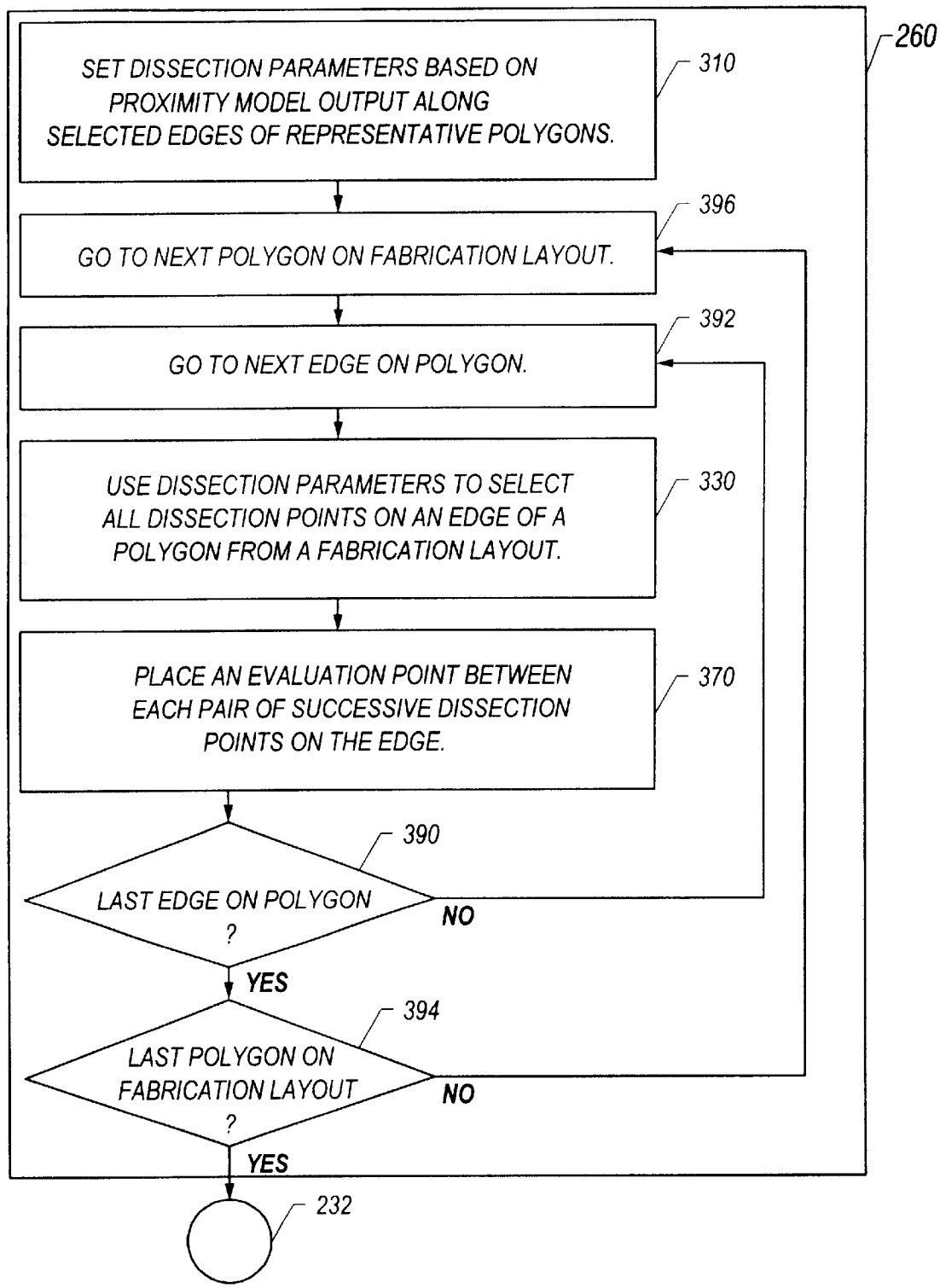
FIG. 3 is a flow chart of a process for selecting dissection points according to one embodiment.

An overview of one embodiment for the new dissection/evaluation points selection process 260 is illustrated in FIG. 3. According to this embodiment, a few dissection parameters are established in response to predictions from a proximity effects model in step 310. In another embodiment, a human operator sets the dissection parameters. Those few dissection parameters represent the necessity of dissection along varying portions of various types of edges. These parameters are used to select all the dissection points and evaluation points on an edge of a polygon of a fabrication layout in step 330. In step 370, an evaluation point is placed on each segment defined by a pair of successive dissection points on the edge. The process then continues over all the edges needing dissection, on all the polygons in the layout.

For example, in step 390, it is determined whether the current edge is the last edge on the current polygon. If not, process flow passes to step 392 where the next edge requiring dissection on the polygon is selected and made the current edge. Flow then returns to step 330 in which the edge newly made current is dissected according to the dissection parameters. If the edge just processed by steps 330 and 370 is the last edge of the current polygon, process flow passes to step 394 in which it is determined whether the current polygon is the last one needing dissection in the fabrication layout. If not, the next polygon is made the current polygon in step 396, and control passes to step 392 in which the first edge needing dissection on the polygon is made the current edge. If the current polygon is the last on the layout then flow passes to step 232 of FIG. 2, where the proximity effects model is run at the selected evaluation points.

In an alternative embodiment, step 394 includes making another fabrication layout the current fabrication layout and then passing control to step 396. Such a subsequent layout may be necessary to dissect; for example, when the two fabrication layouts are used to doubly expose the same printed features layer, so that edges from the second fabrication layer become part of the printed features layer. This circumstance will be described in more detail later below.

Examples of Selecting Dissection/Evaluation Points & Setting Dissection Parameters Using a Proximity Effects Model According to one embodiment, the proximity effects model is used to set the dissection parameters, for example, in step 310. These parameters remain constant during the dissection of several polygons in step 330, on one or more proposed fabrication layouts during the fabrication layout design process, step 230.

Herein the term amplitude is used to describe the proximity effects model output associated with a location no matter what model is used. In general, the models are built to accept input representing polygons of opaque or transparent material. In general, an amplitude value is then produced for each location of interest. A threshold amplitude between the minimum amplitude value and the maximum amplitude value can be associated with the model. As used here, the threshold amplitude is associated with the location where the edge of a feature is actually printed. For example, where spatial deviation is output by the model, a threshold of zero marks the location of an edge. As another example, where the model output is simple optical intensity, a non-zero positive value associated with the printed edge serves as the threshold. In some models, the threshold value associated with an edge may itself be a function of several variables such as the optical intensity and intensity gradient at a location.

To understand how dissection parameters can be derived from proximity effects model output, consider FIGS. 4 and 5.

Figure 4A:
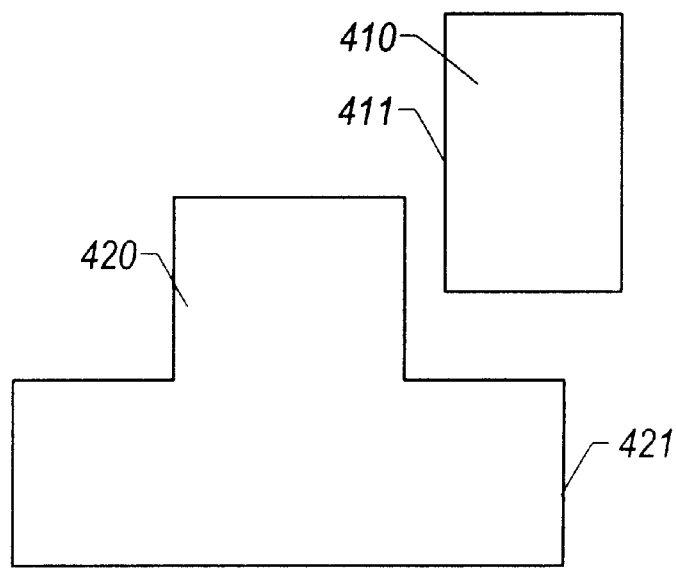
FIG. 4A is a plan view of elements on a mask used as input to an illustrative proximity effects model.
Figure 4B:
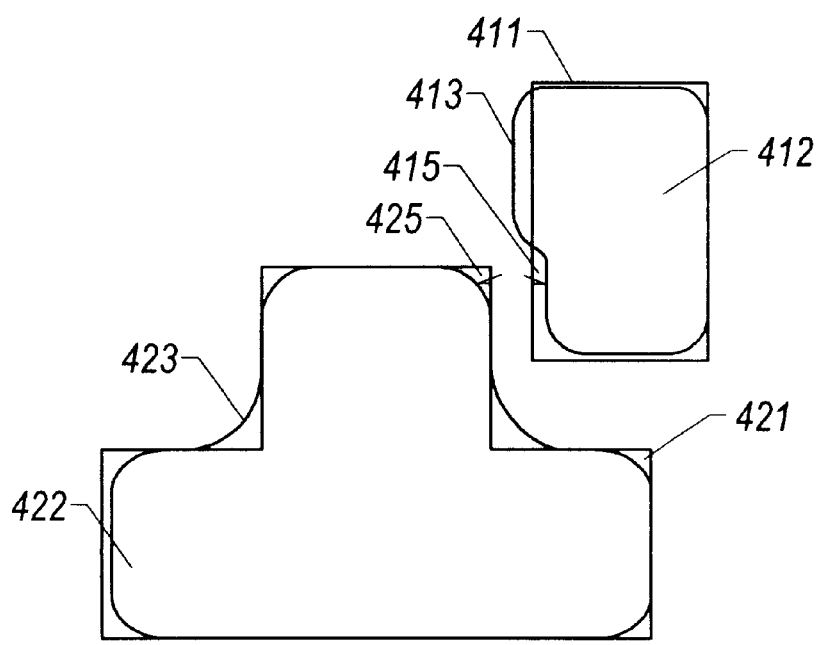
FIG. 4B is a plan view illustrating printed features with proximity effects that might result from the mask items of FIG. 4A superposed on an ideal projection of the mask items.

FIG. 4A shows two items 410 and 420 represented by polygons 411 and 421, respectively, in a mask layout provided as input to a proximity effects model that has been developed for a particular suite of equipment and settings. FIG. 4B shows the printed features 412 and 422, with shapes 413 and 423, respectively, that would be produced from a mask formed from the mask layout of FIG. 4A according to the proximity effects model. For reference, FIG. 4B also shows the polygons 411 and 421 if those were projected perfectly onto the printed features layer. The differences between the ideal and actually printed features are due to proximity effects. For example, arrow 415 shows the deviation of printed feature 413 from the design layout polygon 411 at one location on the polygon 411. Similarly, arrow 425 shows the deviation of printed feature 423 from the design layout polygon 421 at a location on that polygon 421. These deviations are output by one kind of proximity effects model.

Figure 4C:
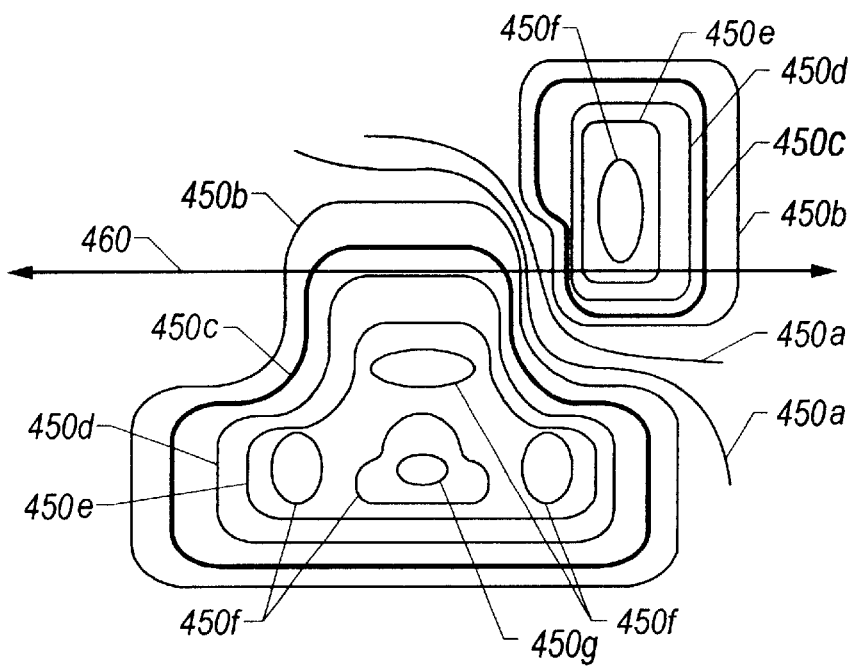
FIG. 4C is a graph of contours of constant model amplitude output on a two dimensional array resulting from the input of FIG. 4A for the exemplary proximity effects model.

FIG. 4C illustrates contours 450*a*–450*g* of constant amplitude on a two dimensional array of model output for one kind of proximity effects model, if it were to be run for every point on such an array. One particular contour representing the threshold value, contour 450*c*, is shown as a bold line. The shapes formed by the bold contour 450*c*represent this model's prediction of the shape of the printed features accounting for all proximity effects in the system. As can be seen by the bold contour 450*c* in FIG. 4C, this proximity effects model predicts printed features with shapes that agree with those that actually would be produced on the printed features layer, as shown in FIG. 4B.

For simplicity of explanation, the proximity effects model that outputs contours like those shown in FIG. 4C is used as an exemplary proximity effects model in the rest of this specification, unless otherwise stated. The techniques of the present invention, however, work with any proximity effects model, including those models which have been calibrated to produce amplitudes representing the predicted printed feature.

Figure 4D:
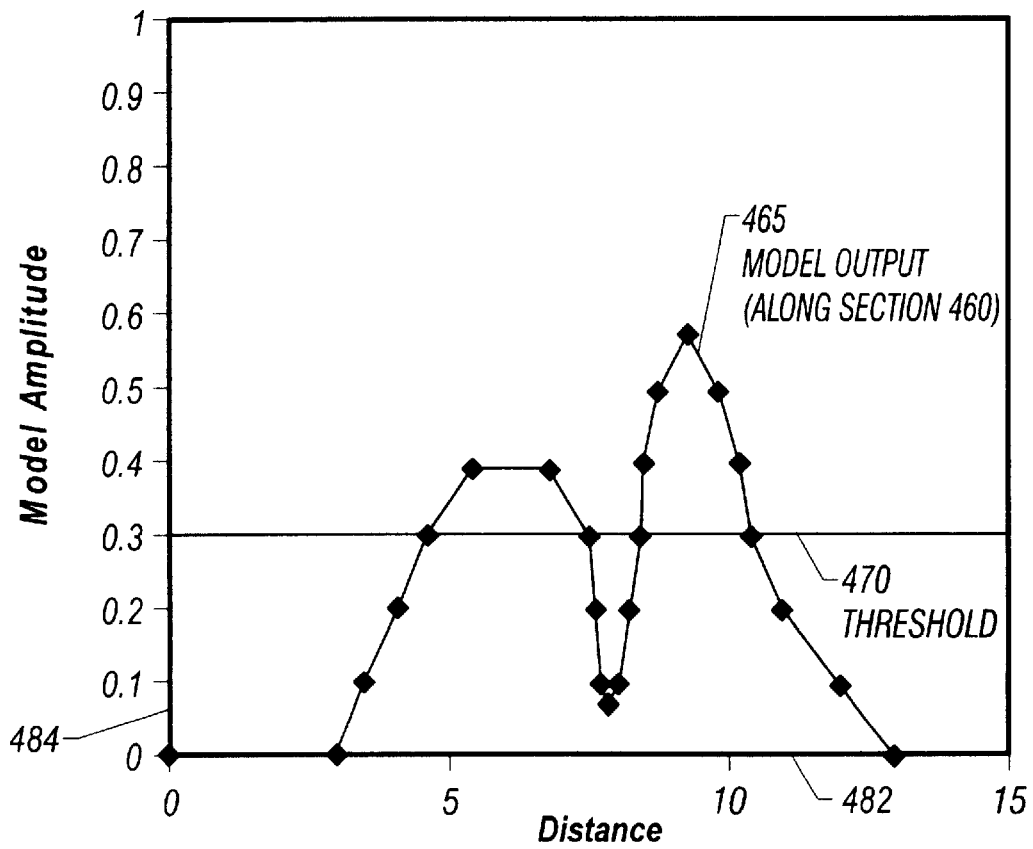
FIG. 4D is a graph of a profile of model amplitude along a line shown in FIG. 4C for the exemplary proximity effects model.

FIG. 4C also shows a double arrow 460 along which a profile of model amplitude is plotted in FIG. 4D. In FIG. 4D, model amplitude is expressed in arbitrary units on the vertical axis 484 from zero to a maximum represented by a value of 1.0. Distance along the double arrow of FIG. 4C from left to right is shown on the horizontal axis 482 of FIG. 4D, in arbitrary distance units. Along this profile the model amplitude begins at zero, rises steadily from about 3 distance units to about 5 distance units, flattens out to about 7 units, then dips at about 8 units, rises to a peak at about 9 distance units, and then falls off to zero again at about 13 distance units.

The threshold value 470 of about 0.3 model amplitude units corresponds to the value of contour 450*c*. Where the model output 465 is above the threshold value 470, a feature is predicted to be printed in the printed features layer; where the model output 465 is below the threshold value 470, no feature is predicted to be printed. Where the model output 465 equals the threshold value is where the edge of the printed feature is predicted to lie. Of course model output units are arbitrary and could be inversely related to what is printed, so that low amplitudes represent printed features and high amplitudes represent no printing. In such a case, the threshold would mark the value below which a feature is printed.

The selection of dissection points and the derivation of dissection parameters from a profile of model output is illustrated in FIGS. 5A, 5B, 5C and 5D.

Figure 5A:
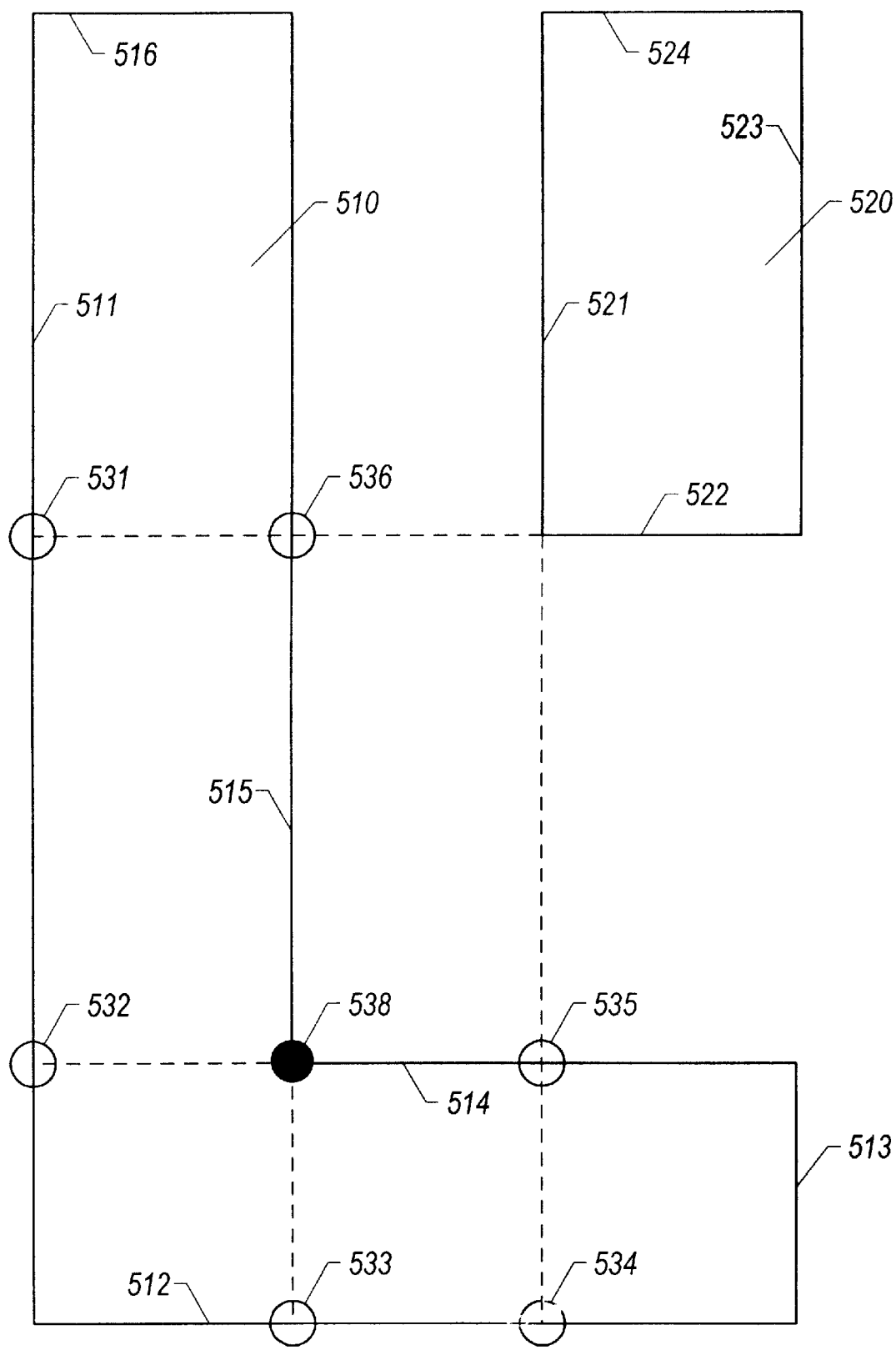
FIG. 5A is a plan view of elements on a second mask layout used as input to a second proximity effects model.

FIG. 5A is a plan view of elements on a second mask layout used as input to another proximity effects model. The mask elements include two transparent items, 510 and 520, represented by a first polygon with edges 511 through 516 and a second polygon with edges 521 through 524, respectively. On the polygon of item 510, points 532 and 533 indicate where proximity effects are expected to vary sharply because of the corner point 538 between edges 514 and 515. Also shown are points 531, 534, 535 and 536 on the polygon of item 510 where proximity effects are expected due to the corner between edges 521 and 522 of the polygon of item 520. Points 531 through 536 are projection points, where proximity effects on one edge are expected to vary sharply because of the proximity of vertices of other edges.

A profile of model amplitudes along one of these edges reflects the size of proximity effects on that edge for this particular layout and model (where the model represents this particular suite of fabrication equipment and settings). By using information in this profile of amplitudes, a better dissection of this edge can be performed in which the segment length depends on the proximity effect magnitude.

Figure 5B:
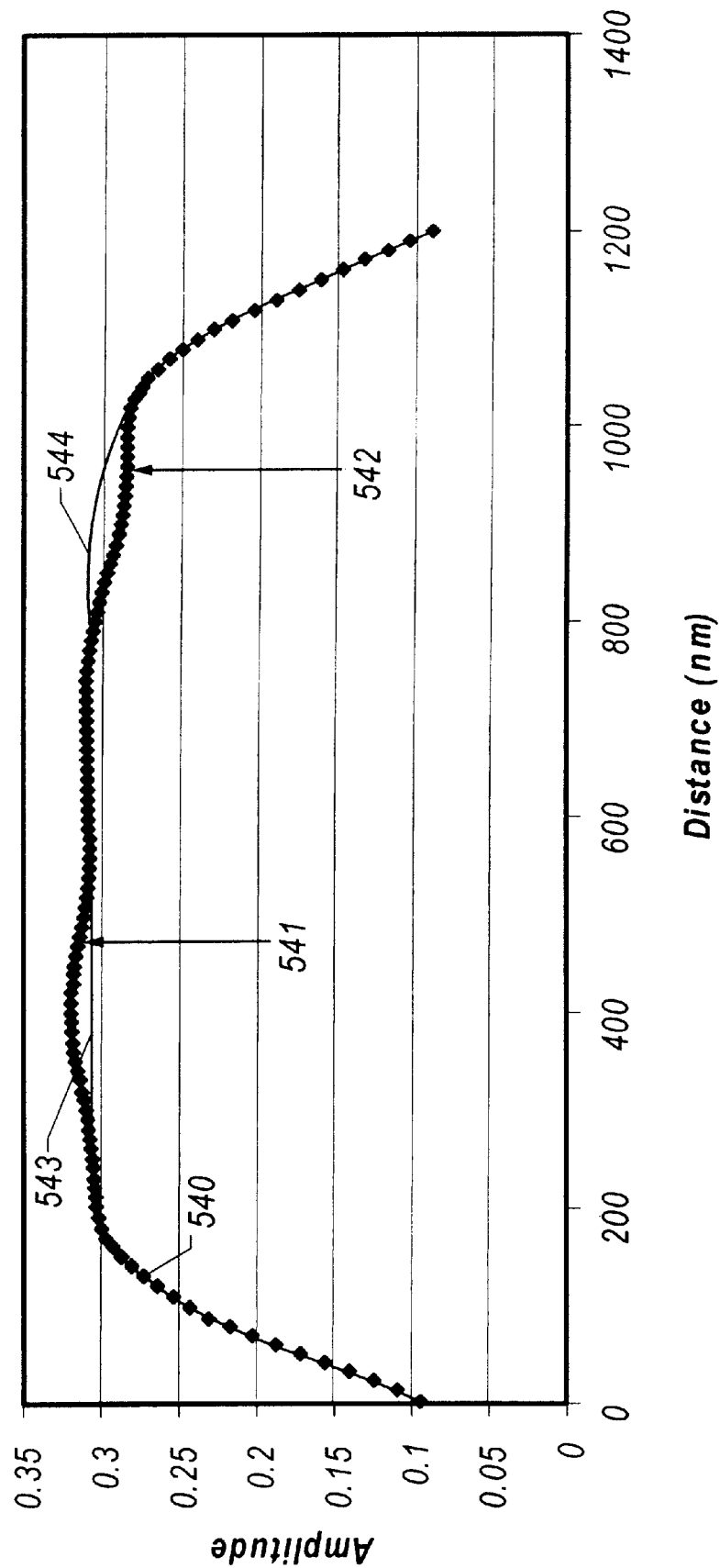
FIG. 5B is a graph of a profile of model amplitude along an edge of a polygon from FIG. 5A.

FIG. 5B is a graph of a profile 540 of model amplitude along edge 511 of the polygon of item 510 shown in FIG. 5A, from its vertex in common with edge 516 to its vertex in common with edge 512. For purposes of illustration, the threshold for this model is taken as 0.23. This model then predicts that this edge 511 will print from about 100 nanometers (nm) to about 1100 nm. Arrow 541 indicates the location of projection point 531 and the value of amplitude at that projection point. Curve 543 indicates where the amplitude curve 540 would be expected to lie if there were no variation in proximity effects on edge 511 due to item 520. Arrow 542 indicates the location of projection point 532 and its amplitude. Curve 544 indicates where the amplitude profile 540 would be expected to lie if there were no variation in proximity effects on edge 511 due to corner point 538. As expected, the proximity effects represented by curve 540 vary in the vicinity of the projection points.

This profile 540 is used to illustrate how particular dissection points are selected on this edge, as well as how the dissection parameters used for dissecting other edges are derived from model output on this edge, according to this embodiment. In other embodiments, variations on the techniques described here are used.

This profile 540 illustrates a length scale of proximity effects at corners of a polygon. That corner length scale is found from a vertex of the edge to a position where the profile flattens near amplitude 0.3. That length scale is about 200 nm. In an alternative embodiment, the corner length scale is selected to be the distance to the threshold value of 0.23, which is about 150 nm. In still another embodiment, the corner length scale is taken to be a distance to an amplitude that is a given percentage of the threshold value. In this case, the given percentage is selected based on how aggressive a correction is sought in the vicinity of corners. Where more aggressive correction is desired, the percentage is chosen to be less than 100%. Where less aggressive correction is desired, the percentage is chosen to be greater than 100%. In still other embodiments, the corner length scale is associated with types of corners, e.g., concave or convex, or angle at the corner, or both. The corner length scale so derived provides a target length to use when dissecting corners where the edge allows.

This profile also suggests a length scale for details near projection points. Considering both sides of each projection point, that detail length scale should be about half the distance over which curve 540 deviates from curves 543 and 544. That detail length scale is about 100 nm. The detail length scale so derived provides a target length to use when dissecting details where the edge allows. This profile also suggests a maximum length scale where the curve 540 hardly varies at all, between the two projection points, of about 300 nm. The maximum length scale so derived provides a target length to use when dissecting edges away from corners and details, where the edge allows.

Along other edges, the distances for the amplitude curve to flatten, the distances over which projection points have noticeable effects, and the length of the undisturbed sections are expected to vary. Thus, dissection parameters based on these must be derived from the observed distributions of length scales. In a preferred embodiment, instead of using a single corner scale from one polygon of one test layout, a statistical corner scale, such as an average corner scale, or median corner scale, is used as a dissection parameter near corners. The statistical corner scale is derived from the corner segment lengths of several polygons on the same test layout or on several layouts. In other embodiments, different corner scales are derived for different corner types, e.g., concave or convex, or different ranges of angles or both. For example, corner segments associated with acute angles less than 45 degrees can be averaged separately from corner segments associated with intermediate angles from 45 through 80 degrees which themselves are averaged separately from corner segments associated with nearly right angles from 80 to 100 degrees.

In another model where proximity effects are different, the values of the length scales and their distributions are also expected to be different. For example, in an equipment suite with lower resolution optics and material processes, the length parameters are expected to be larger. That is, a distance from a vertex of an edge to a flattening point is expected to be greater for all edges tested, and, therefore, the derived dissection parameter is expected to be larger.

In one embodiment, an evaluation point for a corner segment is determined on this curve. According to this embodiment, the evaluation point is placed where the curve has a value equal to a given percentage of the amplitude value where the curve first flattens. For example, if the given percentage is set at 75%, then because curve 540 flattens at about 0.31 amplitude units, the evaluation point is selected where the curve has a value of 75% of 0.31, i.e., a value of 0.23. This occurs at a distance of about 100 nm. In another embodiment, the evaluation point is placed where the profile has a value equal to a given percentage of the threshold value, e.g., 90% of the threshold value of 0.23, which is 0.21. This occurs at about 90 nm on curve 543.

The following paragraphs define particular embodiments for determining dissection points and length scales for dissection parameters. Other embodiments rely on variations of these techniques known in the art.

Figure 5C:
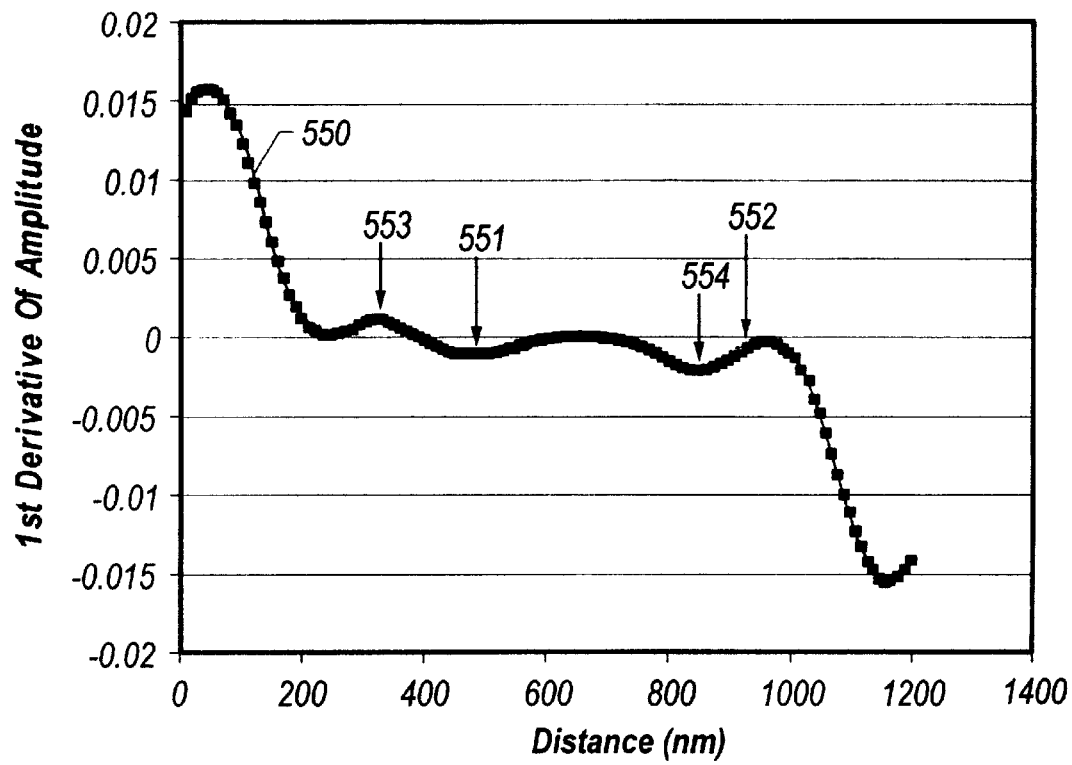
FIG. 5C is a graph of a first derivative of the profile of FIG. 6B showing dissection points according to one embodiment.

FIG. 5C is a graph of a curve 550 representing a first derivative of the profile 540 of FIG. 5B. The first derivative is a measure of the slope of the profile 540 at each point along the profile. Where the profile 540 flattens the slope 550 approaches zero. A particular small value of slope, say 0.001, is chosen to indicate where a profile is flat. A profile is flat where the absolute value of its first derivative is less than this particular value. Starting from a distance of 0 nm, the curve 550 first becomes less than this particular value at about 200 nm. According to this embodiment, a corner segment is placed on this edge from 0 nm to 200 nm where the first derivative decreases to the particular value. The corner segment is marked by dissection points located at the vertex at 0 nm and at about 200 nm.

The 200 nm length of this corner segment is then submitted to a process to derive a corner dissection segment length parameter, Lcor. That process performs a weighted average of this corner length for this edge with other corner lengths from this and other edges to derive the corner dissection segment length, Lcor. In one embodiment, the weights are all the same.

Similarly, moving along edge 511 from its vertex in common with edge 512, at a distance of 1200 nm, the slope first increases above −0.001 at about 1000 nm. That is, the absolute value of the first derivative decreases below the particular value of 0.001 at about 1000 nm. This indicates a corner segment for this edge lies from distance 1000 nm to 1200 nm, and dissection points are placed at both those locations. As above, the 200 nm corner segment length is submitted to the process to derive the corner dissection segment length dissection parameter, Lcor.

FIG. 5C also shows arrows 551 and 552, which indicate the locations of projection points 531 and 532, respectively. Though the absolute value of slope at 551 may exceed the particular value of 0.001, this does not appear to be the case at 552. The slope near the projection point at 552 appears to be affected by the opposite slope associated with the corner segment. Along curve 550, the absolute value of the slope exceeds the particular value of 0.001 also near points indicated by arrows 553 and 554, at about 300 nm and 860 nm, respectively.

According to this embodiment, dissection points are added at each location where the absolute value of slope reaches a local maximum above the small particular value. One embodiment adds dissection points at 553, 551 and 554, which are located at about 300 nm, 480 nm and 860 nm, respectively. Thus, segments that extend from 200 to 300 nm, 300 to 480 nm, and 860 to 1000 nm are added to the two corner segments already defined for this particular edge 511. A residual edge that undergoes further dissection remains between points 551 and 554, from about 480 to 860 nm. Evaluation points are then placed on this edge, one evaluation point on each segment. In this embodiment, each evaluation point is placed midway between the dissection points on each non-corner segment.

The non-corner segment lengths obtained from these embodiments are sent to a process to derive other dissection parameters, such as a detail dissection segment length, Ldet, and a maximum dissection segment length, Lmax. In one embodiment of the process to derive dissection parameters, a histogram of segment lengths is formed and the detail dissection segment length, Ldet, is derived from a mode of the distribution associated with the smallest lengths. In this embodiment, a maximum dissection segment length is derived from a second mode associated with the next smallest lengths. In other embodiments, length scales may be derived from such a distribution of lengths using any methods known in the art. Then, dissection parameters are set based on the derived length scales.

In another embodiment of selecting dissection points from model output along a particular edge, dissection points are also added between these local slope maxima, either at a midpoint, or where the slopes are interpolated to closest approach zero. This embodiment will tend to produce twice the number of segments and cause the dissection parameters derived from the resulting segments to have about half the size. Evaluation points are then placed at the midpoints of the resulting segments.

In still another embodiment, dissection points are added at non-adjacent points where the slope curve 550 has a slope whose absolute value equals the particular minimum slope value, e.g., 0.001. This embodiment adds two dissection points for each local maximum such as at 553 and 554, one on either side of each local maximum.

Figure 5D:
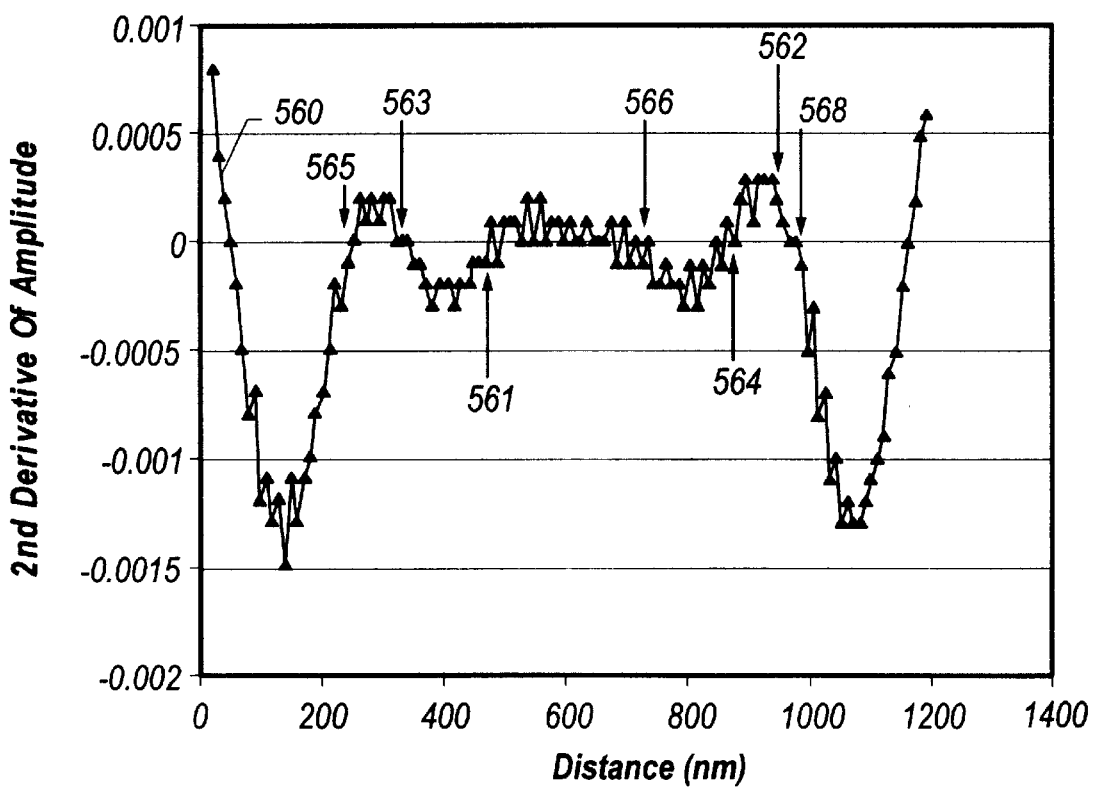
FIG. 5D is a graph of a second derivative of the profile of FIG. 6B showing dissection points according to another embodiment.

In another embodiment, before adding dissection points, the second derivative of the profile 540 is computed and examined. FIG. 5D is a graph of a curve 560 representing a second derivative of the profile 540 of FIG. 5B. The second derivative measures the curvature of a profile. A positive value indicates that the profile is turning about a center above the profile, while a negative value indicates the profile is turning about a center below the profile. A zero indicates an inflection point where the profile is not curved. Arrows 561 and 562 indicate the locations of projection points 531 and 532, respectively.

Both projection points are located near points where curve 560 crosses zero. In this embodiment, dissection points are added wherever the second derivative is interpolated to cross zero. This method can be used even for corner segments if the crossing of zero closest to the corner is ignored. Using this method, one corner segment extends from 0 nm to the point indicated by arrow 565, at about 220 nm, and a second corner extends from the point at arrow 568, at about 990 nm to 1200 nm. These lengths of 220 nm and 210 nm, respectively, are sent to a process to derive a corner dissection segment length, Lcor.

This technique also produces dissection points as indicated by arrows 563 at about 320 nm, 561 (associated with projection point 531) at about 480 nm, 566 at about 760 nm, and 564 at about 880 nm. These points yield non-corner segments of lengths 100 nm, 160 nm, 280 nm, 120 nm, and 110 nm. These lengths are sent to the process for deriving non-corner dissection parameters, and support a detail dissection segment length Ldet of about 110 nm, and a maximum dissection segment length Lmax of about 300 nm.

According to one embodiment, an evaluation point is placed at the point on each segment where the absolute value of the second derivative is a maximum. For example, evaluation points are placed at 100 nm, 300 nm, 400 nm, 800 nm, 950 nm, and 900 nm, where the second derivative curve 560 reaches local extreme values between locations where the curve 560 crosses zero.

Using these example embodiments, a proximity effects model is run for a variety of locations along one or more edges of one or more polygons. The polygons can be selected from a proposed or final mask layout, or from a design layer of a design layout, or from a test mask used to build the proximity effects model. The profile of model output along the edge is used to select dissection points and evaluation points for that particular edge. The resulting segment lengths for the particular edge are used with segment lengths obtained for other edges to derive target lengths to use as dissection parameters.

This technique allows the proximity effects model to be run at a few locations, i.e., along certain edges, rather that at every point in a layout. Certain important edges are dissected directly, and the remaining edges are dissected using the dissection parameters. The proximity effects model is then run for all other edges only at the evaluation points. Thus a large number of model runs are avoided and the computation proceeds at a desirable rate. At the same time, the evaluation points are reasonably selected to give the necessary detail on all the edges.

Deriving Dissection Parameters from a Test Mask

The profiles such as 540 can be generated by any method known in the art. In one embodiment, the test patterns used to build the model are used. These test patterns already include a range of features at different scales and model output computed on a relatively dense output grid. Thus with substantially no additional computations than those already made to build the proximity effects model in the first place, model amplitudes along various polygon edges are already available for deriving dissection parameters.

In another embodiment, the corner length scale is derived from the model output at a series of features of varying pitch. Pitch refers to the smallest distance between repeated features in a layer. The use of features of varying pitch to derive a length scale appropriate for a given model is shown in FIG. 6.

Figure 6:
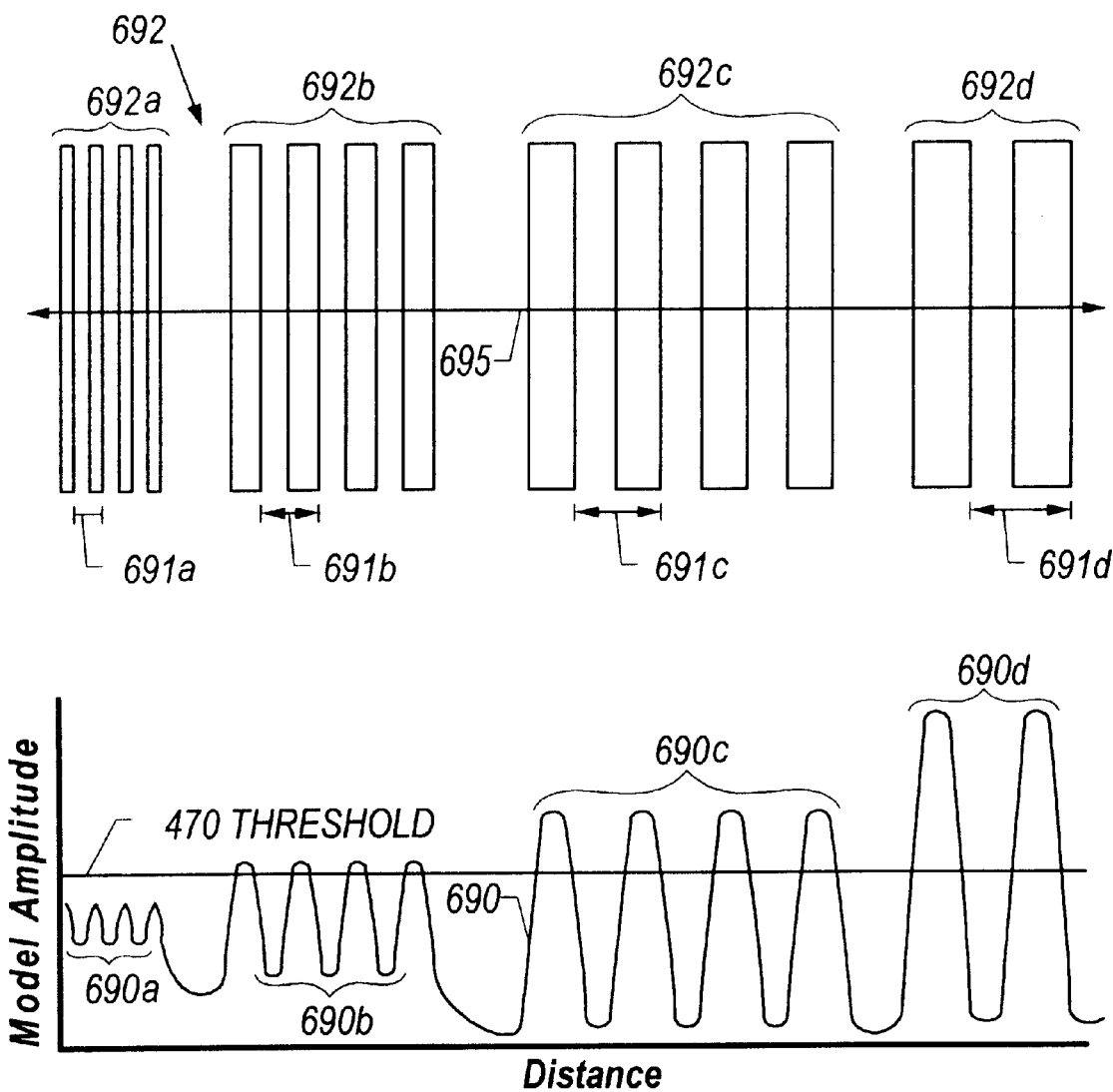
FIG. 6 shows an exemplary test pattern for a fabrication process, a profile location, and the corresponding exemplary model output along the profile.

FIG. 6 shows an exemplary test pattern 692 of elongated polygons for a suite of fabrication equipment. FIG. 6 also shows a profile location 695, and the corresponding exemplary model 690 amplitudes along the profile. The pitch associated with portion 692a of the test pattern 692 is illustrated by the separation 691a. Similarly, portions 692b, 692c and 692d have associated pitches 691b, 691c and 691d, respectively, of ever increasing size. The section 695 is perpendicular to the elongated polygons. The profile 690 on the section shows a portion 690a in which model output never exceeds the threshold amplitude 470 associated with a feature being printed. Thus this portion of the test pattern is too closely spaced to be printed with the equipment suite modeled by the proximity effects model. Portion 690b of profile 690 does cross the threshold amplitude, barely. Other portions 690c and 690d cross substantially above the threshold. In this example, the particular pitch 691b associated with profile portion 690b, represent a transition from unprintable to printable scales. Feature lengths smaller than this particular scale are not likely to have different printable effects. Consequently, dissecting features into segments smaller than this scale will likely generate too many segments and too many evaluation points. It is expected that corrections for such segments will not converge on a solution appropriate for the entire layout. If profile portion 690b had been entirely below the threshold, then a length scale representing the transition from unprintable to printable scales is obtained by interpolating to a pitch at the threshold amplitude on a plot of maximum amplitude versus pitch.

In one embodiment, the particular pitch length scale associated with maximum model output at the threshold value is used to set a corner dissection segment length. In another embodiment, this particular pitch length scale is used to set a detail dissection segment length.

Method for Deriving Dissection Parameters

Figure 7:
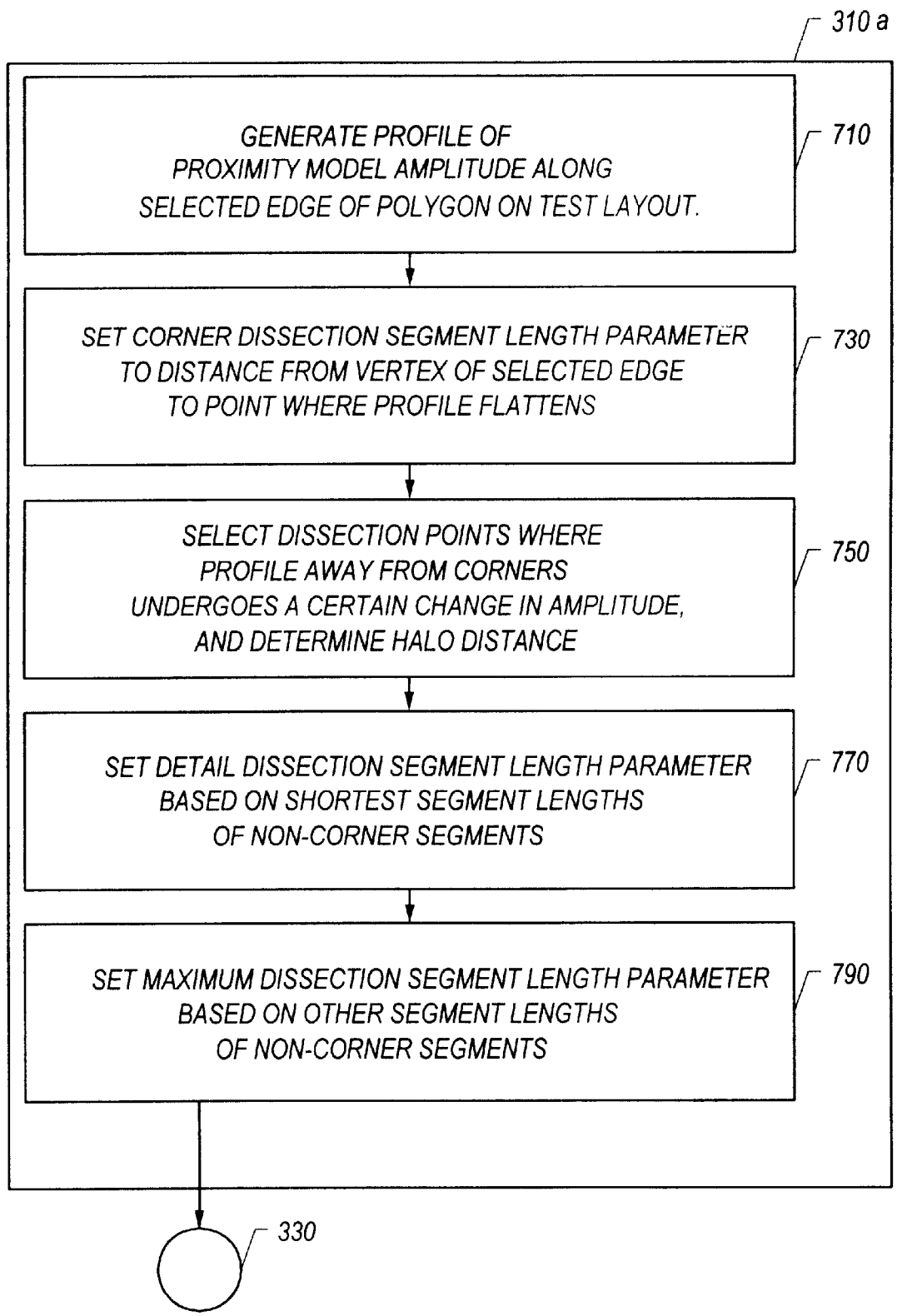
FIG. 7 is a flow diagram for setting dissection parameters according to one embodiment.

FIG. 7 is a flow diagram for setting dissection parameters according to one embodiment of the present invention. This is one embodiment of step 310a for setting dissection parameters based on a proximity effects model output.

In step 710, a profile of proximity effects model amplitudes is generated along at least one edge of a polygon on a test layout. In the preferred embodiment, the test pattern is one used to generate the proximity effects model. In another embodiment, the polygon can be selected on-the-fly from a proposed fabrication layout for an actual printed features layer.

In step 730, a corner dissection segment length parameter, Lcor, is set to a distance scale representing the distance from a corner, i.e., a vertex of the polygon defining the current edge, to a point on the profile where the profile flattens. The profile is flat, for example, where successive points undergo less than a certain change in amplitude or absolute value of the slope is less than a particular minimum value. In other embodiments, Lcor is set to a distance scale representing the distance from the corner to a particular percentage of the flat portion, or a particular portion of the threshold, or where the second derivative crosses zero. In some embodiments, a set of Lcor parameters are defined, one for each corner type or angle range or both, and set to appropriate distance scales.

In step 750, dissection points are selected away from the corners, defining non-corner segments, based on changes in model output, such as based on the first derivative or second derivative of the model amplitude profile. This step can also be used to define a halo distance, i.e., a separation between features beyond which no dissection points are necessary on an edge. With a halo distance so defined, if some vertex of another edge is within the halo distance of a non-corner segment of the edge whose profile is being examined, a dissection point should be necessary.

In step 770, the detail dissection segment length parameter, Ldet, is based on the segment lengths of the non-corner segments. For example, the detail dissection segment length is set equal to a mode in the distribution of non-corner segment lengths associated with the shortest segment lengths. For a second example, the detail dissection segment length is set to a particular percentile of non-corner segment lengths, such as the $5^{th}$ percentile length or $10^{th}$ percentile length.

In step 790, the maximum dissection segment length parameter, Lmax, is based on the segment lengths of the non-corner segments that are substantially longer than the detail dissection segment length. For example, the maximum dissection segment length is set equal to a second mode in the distribution of non-corner segment lengths, a mode not associated with the shortest segment lengths. For a second example, the detail dissection segment length is set to a particular percentile of non-corner segment lengths, such as the $25^{th}$ percentile length, the $50^{th}$ percentile length (the median segment length), or the $75^{th}$ percentile length.

When the halo and dissection lengths are defined, then control passes to step 330 to use these parameters to dissect polygons in an actual fabrication layout.

Modified Selection of Dissection and Evaluation Points

In one embodiment, dissection points are based on the vertices of the polygon and five prescribed dissection parameters. The five prescribed dissection parameters include:

corner segment dissection length (Lcor);

detail segment dissection length (Ldet);

maximum segment dissection length (Lmax);

true-gate extension length (Lext); and halo distance (halo).

The vertices and dissection parameters are first used to determine an edge type. Edges shorter than the shortest prescribed segment length are not worth evaluating and so have no dissection points or evaluation points selected. Edges long compared to twice the corner segment length have a dissection point placed about Lcor from each vertex. A projection point is located on an edge at the closest point to a vertex of another edge, if that vertex is within the halo distance. Long portions of edges away from the corners and without projection points, i.e., residual edges, may be dissected to prevent segments longer than Lmax. Next to corner segments and near projection points, segments should be about Ldet long. Edges of true-gates have lengths increased by the true-gate extension length, Lext, to prevent underexposure of these important features.

In other embodiments, multiple versions of these parameters are defined. For example several Lcor parameters are defined to distinguished convex from concave corners and to distinguish square corners from acute and middle angle corners. As another example, several Lext parameters are defined to distinguish extensions toward an end cap from extensions toward a connector, explained below.

Figure 8A:
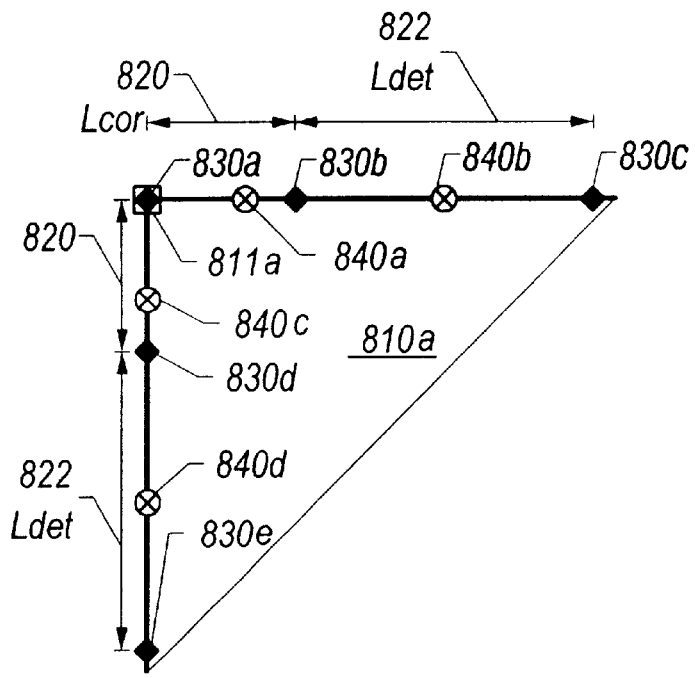
FIGS. 8A–8E are partial plan views of polygons from mask layouts showing placement of dissection points and evaluation points according to one embodiment.

One use of prescribed dissection parameters Lcor and Ldet is illustrated in FIG. 8A. FIG. 8A is a plan view of a vertex 811 a of a polygon where two edges long compared to Lcor and Ldet meet. The vertex 811*a* is selected as a dissection point 830*a*. On the horizontal edge, the next selected dissection point 830*b* is a distance Lcor 820 from the vertex 811*a*. Dissection points 830*a* and 830*b* define a corner segment. The first segment next to the corner segment has a length Ldet 822, which causes the dissection point 830*c* to be selected. Similarly, on the vertical edge, the first dissection point 830*a* is the vertex 811*a*, and the next selected dissection point 830*d* is a distance Lcor 820 from the vertex 811*a*, while the next dissection point 830*e* is a distance Ldet from there.

There is one evaluation point 840 between each pair of dissection points on an edge. Away from the corner segments, the evaluation points are placed substantially halfway between the dissection points. For example, evaluation point 840*b* is halfway between its associated dissection points 830*b* and 830*c*. This is done because the evaluation point represents the whole segment between the dissection points; and any correction computed for the evaluation point, such as moving the edge x distance units outward, will be applied to the whole segment. Treating the whole segment together is reasonable because the corrections needed are expected to vary slowly along a single segment. That is how the segment length parameters were chosen—to represent a distance associated with each substantial change in proximity effects.

In the corner segments of this embodiment, however, the evaluation points are not halfway. Instead, in this embodiment, the evaluation point is placed two-thirds (⅔) of the way from the convex vertex to the next dissection point. In other embodiments, the evaluation point is placed substantially more than halfway from the vertex to the next dissection point. The placement of evaluation points farther from the vertex is reasonable because the proximity effects in the corner tend to increase more rapidly as the corner is approached. Halfway from the corner the changes are still large compared to the inside dissection point which abuts the next segment. A smaller correction is desired than at the halfway point to avoid big differences with the abutting interior segment.

FIG. 8A illustrates the use of two of the prescribed dissection parameters. In addition to the segments with lengths substantially equal to the prescribed parameters, this embodiment includes some segments which have lengths which depend on the prescribed parameters but vary from them by an amount determined by the actual length of an edge between successive vertices of the polygon. The derived lengths include Effective line-end segment length (dmin);
Effective turn-end corner segment length (dcor); and
Effective interior, flat segment length (dmax).

Figure 8B:
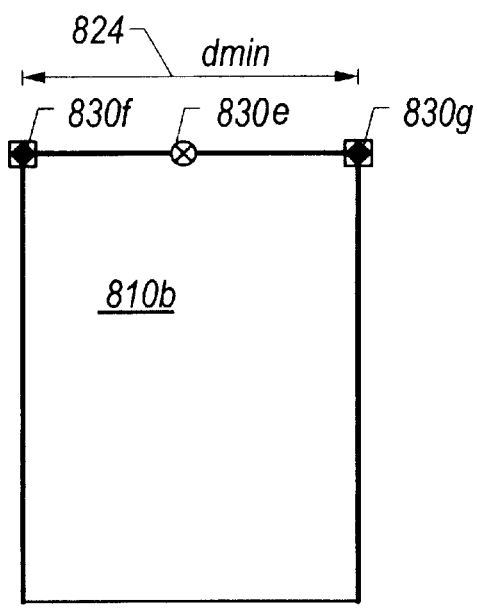

Line-end segments occur on polygon edges that are no shorter than the shortest prescribed segment length but not long enough to generate more than one segment. Line-ends are likely underexposed or overexposed along their entire length. Such edges are not dissected further but do have an evaluation point. Thus on such edges, the dissection points are the vertices and the evaluation point is placed midway between. The segment and the edge are coincident. Though controlled by the prescribed dissection parameters, the actual segment lengths, dmin, are derived from the vertex positions. FIG. 8B illustrates a line-end edge of polygon 810*b*. Dissection points 830*f* and 830*g* are placed at vertices and evaluation point 840*e* is placed midway between them. The segment has a length dmin 824 derived from the distance between the vertices. Because dmin is greater than the lesser of prescribed parameters Ldet and Lcor, but shorter than (Ldet+2*Lcor), this edge is treated as a line-end and is given segment length dmin substantially equal to its edge length, L. Not shown is a line end comprising two concave vertices. It is treated the same way as the depicted line end with two convex vertices. An edge characterized as a line-end is never dissected into two segments.

Figure 8C:
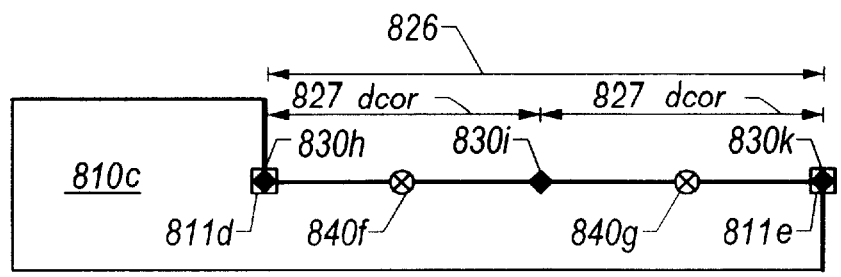

Turn-end edges are also longer than the shortest prescribed length but involve one concave vertex and one convex vertex, such as shown in FIG. 8C. Thus a turn-end often involves an underexposed corner 811*d* and an overexposed corner 811*e*. In addition, a turn-end involves two corners so close together that there is not enough distance for a segment of length Ldet between them. That is, edge length L 826 is less than (Ldet+2*Lcor). Such an edge is unlikely to have a properly exposed segment. Depending on the actual length of a turn-end edge, L 826, it gets either a single evaluation point at its midpoint with both vertices being dissection points, or it is split evenly by three dissection points 830*h*, 830*j* and 830*k* into two segments of length dcor 827, as shown in FIG. 8C. Though its segment length is controlled by the prescribed dissection parameters Lcor and Ldet, its actual segment length, dcor 827, is derived from the positions of the vertices and their edge length L 826. In the embodiment shown in FIG. 8C, the evaluation points 840*f* and 840*g* are placed in the middle of both segments. In another embodiment, at least one segment is considered a corner segment with an evaluation point more than halfway from a corner to the middle dissection point 830*i*.

Corner, line-end and turn-end dissection lengths are used in those circumstances even if projection points are also present. Projection points control segment lengths in the interior portions of an edge away from the vertices, as will be described later below. Away from corner segments (including all of short edges like line-ends and turn-ends) and projection points, residual portions of an edge are divided evenly so that no segment is greater than Lmax and no segment is shorter than the shorter of Lcor and Ldet. Though controlled by the prescribed dissection parameters Lcor, Ldet and Lmax, the actual length of these segments (dmax)(see dmax 829, for example, in FIG. 8D) is derived from the original vertex positions.

Figure 8D:
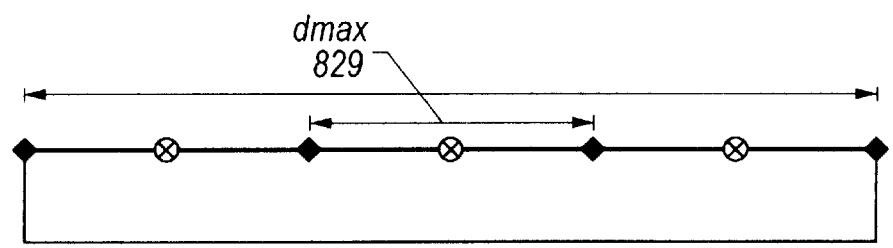

FIG. 8D shows a situation in which outer dissection points 830*m* and 830*n* were selected based on corner segments or projection points or both. The residual edge length 828 is longer than twice Ldet and may be split further. The residual edge length 828 is first dissected with two segments Ldet long, one at each end, unless such dissection leaves a remaining edge 829 less than Ldet. In this case 828 is simply divided in half. Otherwise, if the remaining edge length L 829 is no shorter than Ldet, it is divided by Lmax and the ceiling integer N of the quotient is found. The ceiling integer, or simply ceiling, is the smallest integer that is greater than or equal to the quotient. For example the ceiling of 9/3 is 3 but the ceiling of 10/3 is 4. The remaining edge length is divided by the ceiling to produce a length dmax for each remaining segment. That is, remaining edge of length L 828 is divided into N segments of length L/N. This is accomplished by placing an additional N−1 dissection points evenly spaced between the existing dissection points. For example, in FIG. 8D, two new dissection points 830*o* and 830*p* are evenly spaced between dissection points 830*m* and 830*n* to produce three equally long segments with length dmax, where dmax equals L/3. By using the ceiling integer N, dmax is guaranteed to be less than Lmax.

Figure 8E:
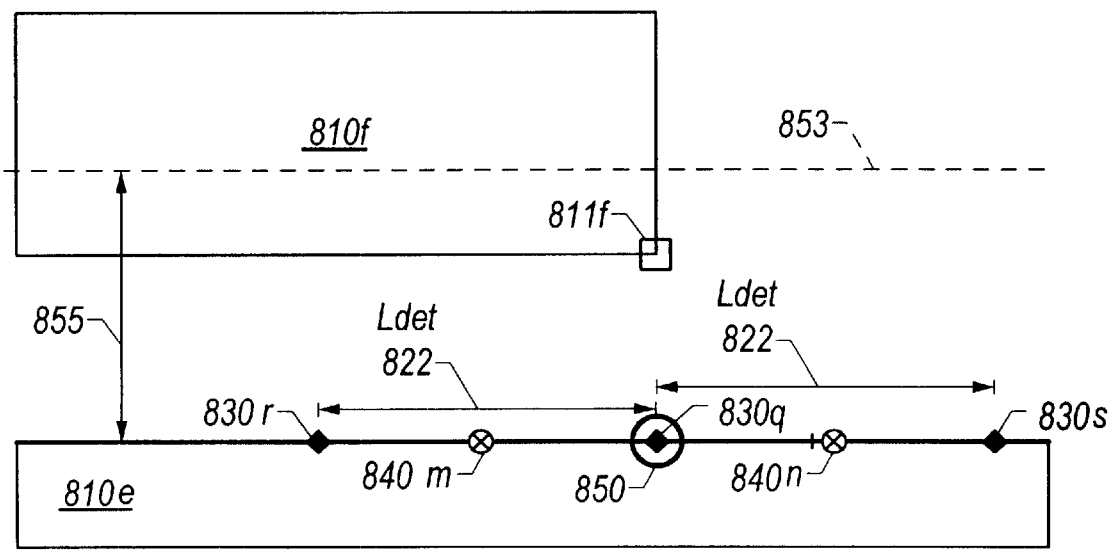

Dissection due to a projection point is illustrated in FIG. 8E. In this embodiment, the halo distance 855 is used to determine whether any vertex from another edge is within range to induce a sharp change in proximity effect on the current edge. For example, vertex 811*f* of polygon 810*f* is within halo distance 855 of the current edge of polygon 810*e* being dissected. A projection point is defined, as the closest point on the edge from a vertex of another edge within the halo distance 855. In the preferred embodiment, the halo is defined based on analyzing model amplitudes along an edge on a test pattern as described above. The model radius is the greatest distance at which the model can display an effect, e.g., the length scale of the longest kernel function used in the model. The halo distance is found in this embodiment, by first selecting a particular variation in proximity effect considered significant. Then the halo distance is set substantially equal to the greatest separation between an edge and a vertex of another edge that exhibits the particular variation or more in the test patterns. In another embodiment, a distribution of observed variations is generated, and the particular significant variation is determined from a certain percentile of these variations, e.g., the $10^{th}$ percentile. The halo distance can also be defined manually. In this embodiment, the halo distance is preferably defined to be less than or equal to the model radius, e.g., by a pre-defined percentage less than 100% to multiply by the model radius.

In FIG. 8E, a line 853, parallel to the current edge of the polygon 810*e* and spaced the halo distance 855 apart, marks the area in which a vertex of another edge can cause a projection point. Since vertex 811*f* of another edge is within the halo distance, a projection point 850 is found.

In the preferred embodiment, dissection in the vicinity of the projection point is carried out by placing a dissection point 830*q* at the projection point 850 and at two other points 830*r* and 830*s* spaced Ldet 822 from the projection point 850. Evaluation points 840*m* and 840*n* are then placed at the midpoint of the segments so defined. In another embodiment, an evaluation point is placed at the projection point, and two dissection points spaced Ldet from each other straddle the evaluation point. Such an embodiment is not preferred because it does not allow for different corrections on either side of the projection point as needed for most circumstances, for example, as needed for curve 540 in FIG. 5B. In yet another embodiment, the segment centered on the projection point of this previous embodiment is augmented with two additional segments of length Ldet, one each on either side of the first segment. While such an arrangement allows for different corrections near to and on either side of the projection point, it requires three evaluations rather than the two evaluations of the preferred embodiment.

Where more than one projection point are initially found on an edge within a distance of Ldet along the edge, only one projection point is kept and used for dissection. Any technique that provides a single projection point from the multiple initial projection points can be used. According to this embodiment, the projection point kept is the one having the shortest distance to the vertex of another edge. After this one is selected, all other projection points on the edge within Ldet of the kept projection point are discarded.

Figure 9A:
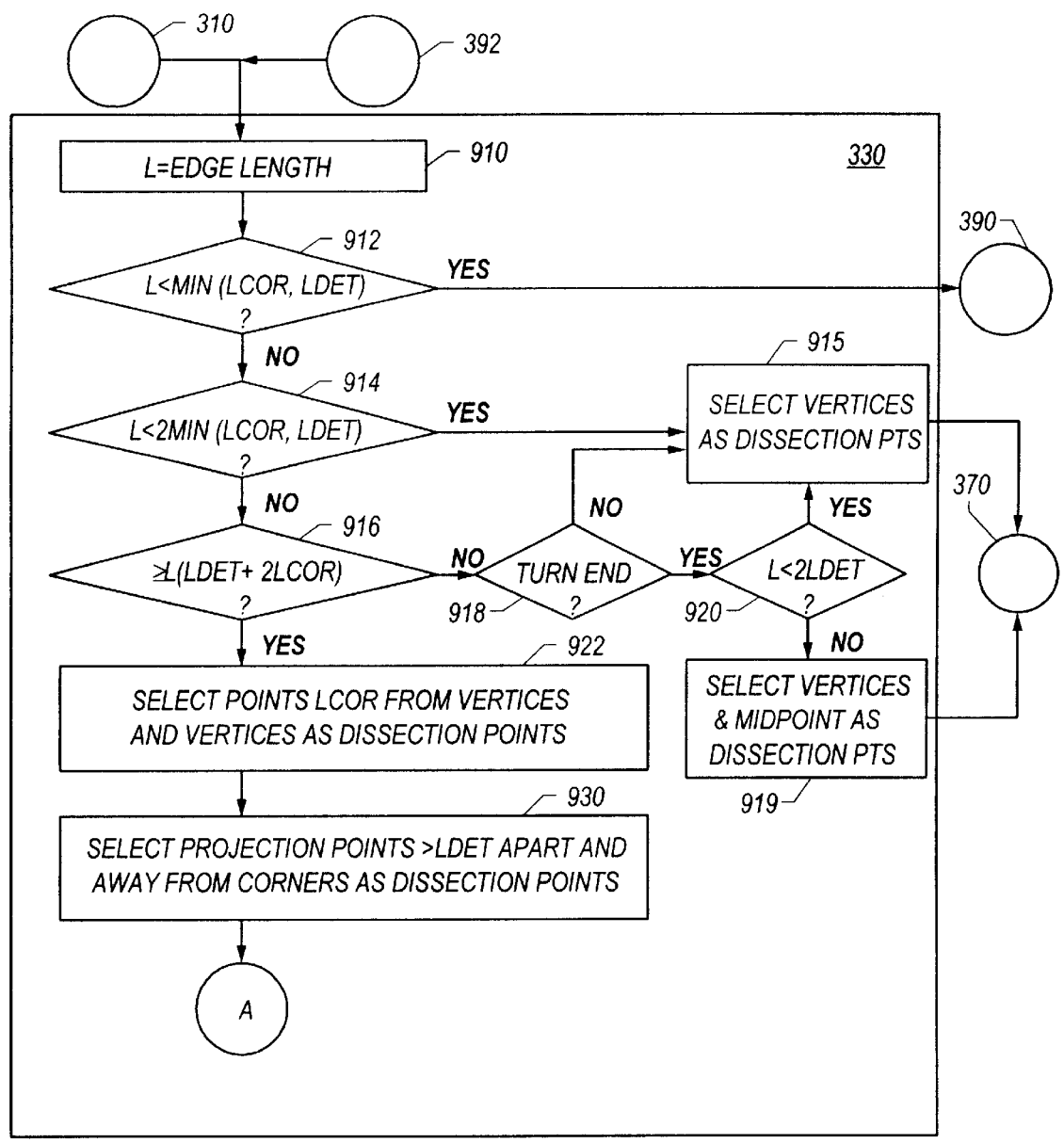
FIGS. 9A and 9B are flow diagrams for selecting dissection points using the dissection parameters according to one embodiment.
Figure 9B:
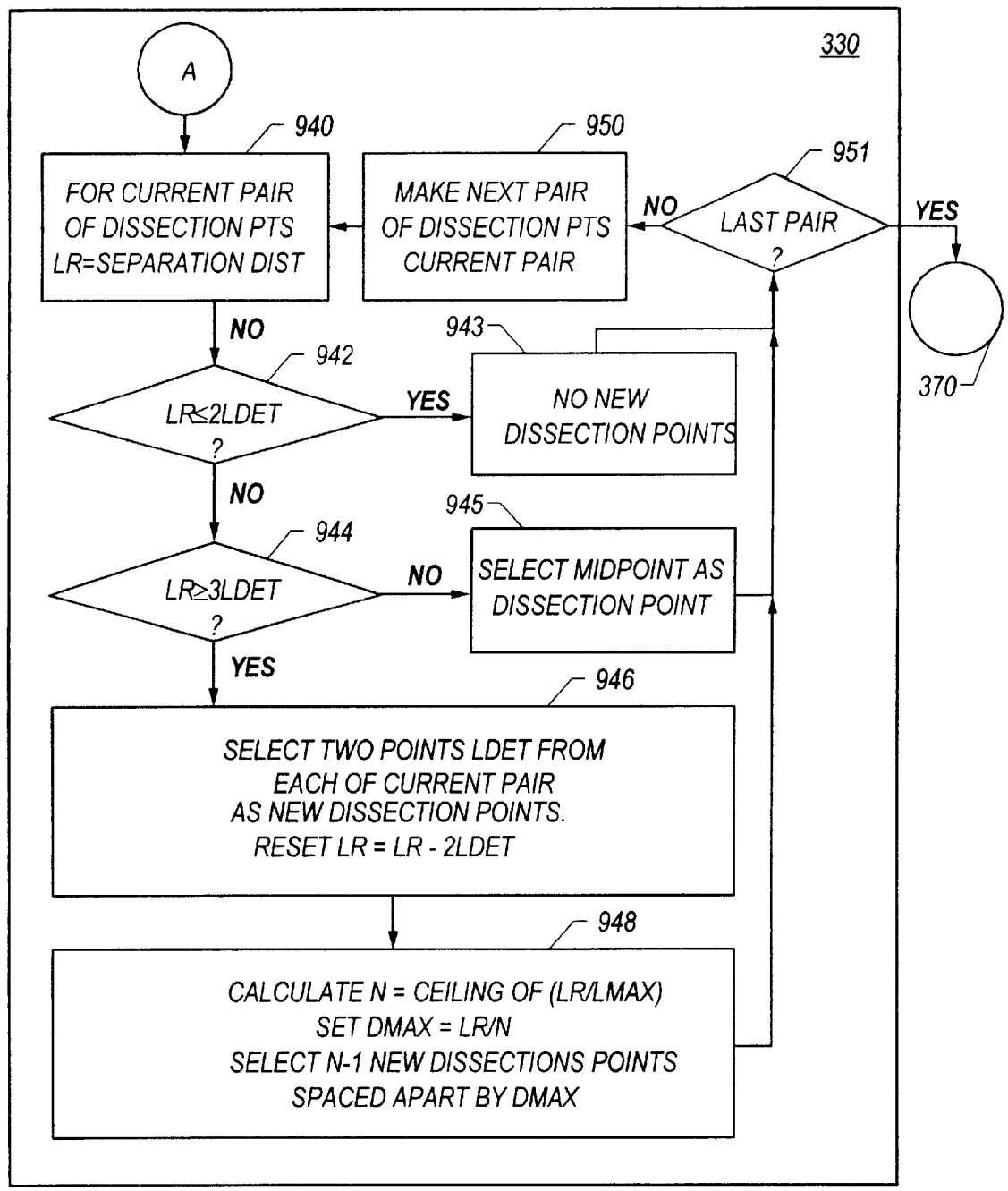

FIGS. 9A and 9B illustrate one embodiment for step 330 of FIG. 3, dissecting an edge using the dissection parameters, which combines all the above considerations.

In step 910 of FIG. 9A the edge length L is determined from the vertices of the current edge. In step 912 it is determined whether the edge length is less than the minimum dissection length, e.g., the lesser of the corner dissection segment length Lcor and the detail dissection segment length Ldet. If so, the edge is too short to merit an evaluation point and the edge is discarded, i.e., not dissected and not given an evaluation point. Control then passes to step 390 of FIG. 3 to obtain the next edge for dissection, if any.

In step 914 it is determined whether the edge length L, which is necessarily greater than or equal to the minimum dissection length, is also less than double the minimum dissection length. If so, then the edge is a line-end or turn end that is treated as a single segment. Dissection points are selected at the vertices in step 915. Control then control passes to step 370 to select an evaluation point, e.g., in the middle of the edge.

In step 916, the edge length L is necessarily greater than double the minimum dissection length, and it is determined whether the edge is long enough to accommodate two corner segments of length Lcor and an intervening segment of length Ldet. If not, the edge is treated as a line end or as a turn-end. In step 918 it is determined whether the edge is a turn end, i.e., includes both a convex corner and a concave vertex. If not, the edge is a line end and dissection points are placed at the two vertices in step 915 and control passes to step 370 to place the evaluation point. If one vertex is a convex vertex and the other is a concave vertex, so that the edge is a turn-end, it is determined in step 920 whether the edge length L is less than double Ldet. If not, then the edge is split evenly into two segments with dissection points at both vertices and at the mid-point of the edge in step 919. If the edge length L is less than double Ldet, then the edge is kept as one segment with dissection points at the vertices in step 915. In either case, control then passes to step 370 to select evaluation points.

If it is determined in step 916 that the edge length is long enough, two corner segments are placed on the edge, by selecting both vertices of the polygon as dissection points as well as selecting the two points spaced away from the two vertices by the distance Lcor in step 922. A residual edge length is computed by subtracting double the corner dissection segment length, i.e., subtracting 2*Lcor, from the edge length L.

In step 930, one or more projection points are selected on the residual edge, for example, as shown in FIG. 8E. If more than one projection point is found, only projection points spaced at least Ldet from another projection point are kept.

In step 940 of FIG. 9B, every pair of dissection points not involving a corner segment, such as dissection points related to a projection point or segment adjacent to a corner segment, is examined and a residual length LR of a further residual edge is computed as the distance between the currently examined pair of points. When no more such pairs of points are left on the edge, flow control eventually passes to step 370 to select evaluation points.

In step 942 it is determined whether the residual length LR is less than twice Ldet. If so, the segment is not further dissected in step 943, and control passes to step 950 to examine the next such pair of dissection points, unless it is determined in step 951 that the current pair is the last pair and control passes to step 370 in FIG. 3. Otherwise control passes to step 944.

In step 944 the residual length LR is necessarily greater than or equal to double Ldet, and it is determined whether the residual length LR is also less than triple Ldet. If not, the segment is split evenly into two segments by adding a dissection point in the midpoint of the segment in step 945. If so, control passes to step 946.

In step 946 the residual length is necessarily greater than or equal to triple Ldet, and two dissection points are added, each Ldet from one of the current pair of dissection points being examined. Then a new residual edge length is computed for the remaining segment between the two new dissection points. Control then passes to step 948.

In step 948, the new residual edge length is divided by Lmax, and the ceiling integer N of the quotient is obtained. The effective length of the remaining segments, dmax, is computed as the residual length divided by the ceiling integer N. By dividing the residual length by the ceiling integer, dmax is guaranteed to be less than or equal to Lmax. Then N−1 evenly spaced dissection points, spaced apart by dmax, are selected in the remaining segment. Control then passes to step 951 to obtain the next such pair of dissection points in 950 unless the current pair is the last pair and control passes to step 370 in FIG. 3.

In one embodiment dissection points and evaluation points are also chosen to be at grid points of a predefined input grid. This additional choice provides the advantage that previously computed model runs can be used for analyzing differences after the edges get dissected.

Specifically Segmenting Certain Edges

In yet another embodiment, the proximity effects model is run for closely spaced points along certain critical edges on a proposed layout or layouts, as described above with respect to FIG. 5. Based on the rates of change of model amplitude along the edge, such as the first and second derivative, the edge is divided into segments. For example, a segment is formed for every change in model amplitude along the edge above a predetermined minimum change. For another example, a segment is defined between every inflection point where the second derivative crosses zero. These segments are not derived from the dissection parameters, but are directly observed on the certain edges. Dissection points are then placed at the segment endpoints and an evaluation point is placed between each pair of dissection points.

This embodiment offers the advantage of customizing the dissection for certain important edges and responding to the actual variations in proximity effects observed along the particular edge.

However, this embodiment requires more computational resources than using dissection parameters because the model is run at many new points along an edge in the fabrication layout for the actual design. This embodiment does not use the pre-computed model values created when the model was built.

Some computation time and power is saved compared to running evaluations at all points on these edges, because a correction is only computed at the more widely spaced evaluation points, one per segment. Once computed, the same correction is then applied to the whole segment. Additional computational time and power can be saved by performing the process only on certain edges expected to suffer from proximity effects, like those on critical features in the layout with dimensions close to the resolution of the fabrication process, or where critical dimensions are within a halo distance of another polygon. For example, this process is used only on edges that include an edge of a true-gate or an edge of a true-gate interconnect.

Including Edges From Double Exposures

Some features on a printed layer are formed by exposing the same layer with masks formed according to two fabrication layouts. For example, in a first exposure, narrow phase-shifted features are formed, then, in a second exposure, wider connections between phase-shifted features are formed. Polygons in the first exposure include pairs of phase-shift windows called shifters, which pass light of the same wavelength but out of phase by 180 degrees (or π radians).

Figure 10A:
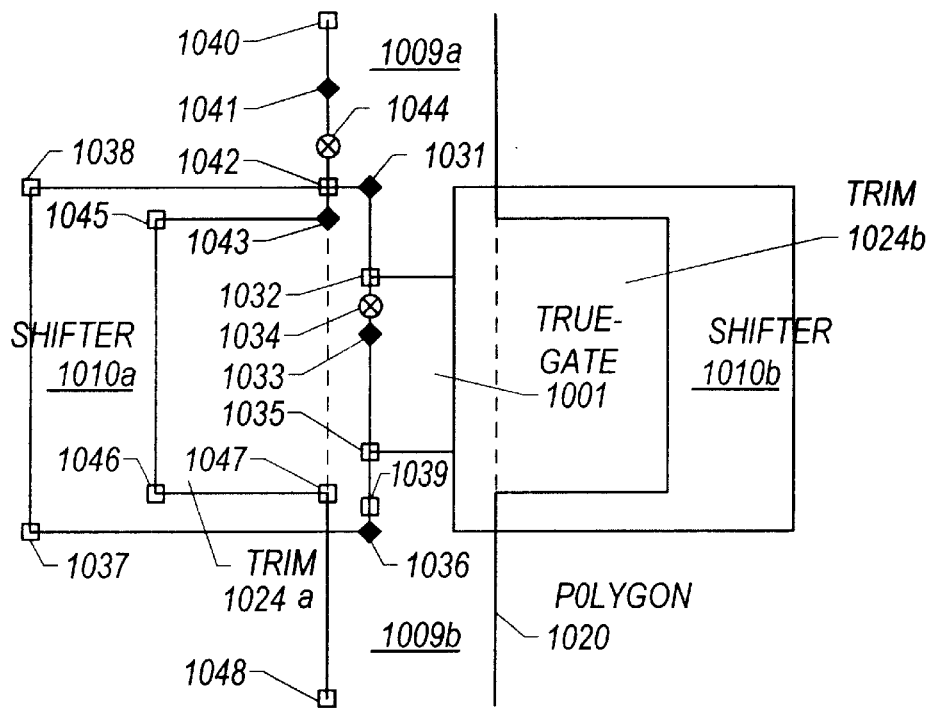
FIGS. 10A through 10C are partial plan views of overlapping polygons from two mask layouts, showing the placement of dissection points and evaluation points when not all of a polygon is printed, according to several embodiments.

FIG. 10A illustrates two rectangular shifters 1010a and 1010b that form a true-gate 1001 along a portion of the area between the shifters 1010. For example, shifter 1010a is bounded by four edges connecting vertices 1031, 1036, 1037 and 1038. Also shown is a polygon 1020 used in a second exposure to connect the true-gate 1001 to other features, not shown, with connecting features 1009a and 1009b. Edges connecting vertices 1040, 1043, 1045, 1046, 1047 and 1048 are on polygon 1020. The polygon 1020 includes wide trim sections 1024 (i.e. 1024a and 1024b) entirely within the shifters 1010 (i.e. 1010a and 1010b) where there is no material on the layer being exposed the second time. The purpose of the trim sections 1024 is to prevent overexposing the edge of the true-gate 1001 during the second exposure. The edges of the trim sections 1024 inside the shifters 1010 do not leave edges on the printed features layer. For example, no edges are printed corresponding to mask edges connecting vertices 1043 to 1045, 1045 to 1046, and 1046 to 1047. Also, the edges of the shifters outside the trim polygon are not printed. For example, the edge connecting vertex 1038 to vertex 1037 is not printed.

Some edges have portions that are printed and portions that are not printed. For example, no edge is printed between points 1043 and 1042 of the polygon 1020 edge connecting points 1043 to 1040. Similarly, no edge is printed between points 1038 and 1042 of shifter 1010a edge connecting point 1038 to point 1031. Such partially printed edges usually involve a point that marks the intersection of a shifter edge with a trim edge, like point 1042.

FIG. 10A also illustrates that some portions of some edges are more important than other portions of the same edge, even though both are printed. For example, on shifter edge connecting point 1031 to 1036, the portion making up an edge of the true-gate 1001, between points 1032 and 1035, is more important than other portions of that edge, that simply provide an extension for the connecting features 1009a and 1009b.

According to these embodiments, dissection points and evaluation points are not placed on edges that are not printed, such as outside edges polygons for shifters or edges of trim polygons inside shifters. For example, when dissecting the polygon of shifter 1010a, the edge connecting vertices 1031 and 1036 contains portions that will be printed, therefore this edge is dissected. However, the edge connecting vertices 1037 to 1038 will not be printed; and therefore it is not dissected.

Also according to these embodiments, dissection points and evaluation points are moved or removed to ensure that segments do not have lengths less than a minimum segment length, and that the evaluation points are on the physically important parts of the segments. According to one embodiment, dissection points are initially placed at the corners of the true-gate, i.e., at points 1032 and 1035 in addition to shifter vertexes 1031 and 1036. The edge of the true-gate is then dissected as if 1032 and 1035 were vertices of a polygon. For example, normally a dissection point is placed at point 1032 and another dissection point is placed a distance Lcor away at 1033, and the evaluation point 1034 is placed two-thirds of the way from point 1032 to point 1033.

However, if the length of the resulting segment from vertex 1031 to true-gate corner 1032 is less than the minimum segment length, e.g., the lesser of Lcor and Ldet, a dissection point is not placed at true-gate corner 1032. Instead, the dissection point at 1031 is used. The evaluation point 1034 for the segment remains on the true-gate edge two-thirds of teh way between points 1032 and 1033. That is, the evaluation point is located as if the corner of the true-gate 1032 were a corner dissection point. Because the segment from vertex 1031 to point 1032 is used to connect the corner of the shifter to the true-gate, it is referred to as the shifter extension, and the shifter extension length is the distance from shifter vertex 1031 to true gate vertex 1032.

This technique has the advantage of simultaneously keeping all segment lengths greater than or equal to the minimum segment length, but ensuring that the evaluation points are on the true-gate, the critical feature in the layout. This is an advantage because it is desired that the correction determined at the evaluation point be applicable to the true-gate, which is the important feature. The dissection of an entire edge, like shifter polygon edge from vertex 1031 to 1036, considering the influence of true gate corners is implemented during an alternative embodiment of step 330 of FIG. 3.

Where a portion of an edge is not printed, dissection points are selected to avoid segments shorter than the minimum dissection segment length and evaluation points are placed on the portion being printed. According to one embodiment, dissection points are initially placed at the intersection of shifter and trim edges in addition to trim edge vertexes. For example, a dissection point is initially placed at intersection point 1042 and at point 1041, a distance Lcor away. The evaluation point is then placed two-thirds of the way from point 1042 to point 1041, as if the intersection point 1042 were a vertex. However, if the non-printed portion of the edge, from point 1043 to 1042, is shorter than the lesser of Lcor and Ldet, the segment from 1041 to 1042 is extended to point 1043. That is, the segment is extended to the trim 1024a by the trim extension distance from 1042 to 1043. The evaluation point remains unchanged, at two-thirds the distance from the intersection point 1042 to the dissection point 1041. The remaining edge of the polygon 1020 is then dissected according to the rules stated above for non-corner segments.

This technique has the advantage of simultaneously keeping all segment lengths greater than or equal to the minimum segment length, but ensuring that the evaluation points are on the printed portion of the edge. This is an advantage because it is desired that the correction determined at the evaluation point be applicable to the printed edge.

Figure 10B:
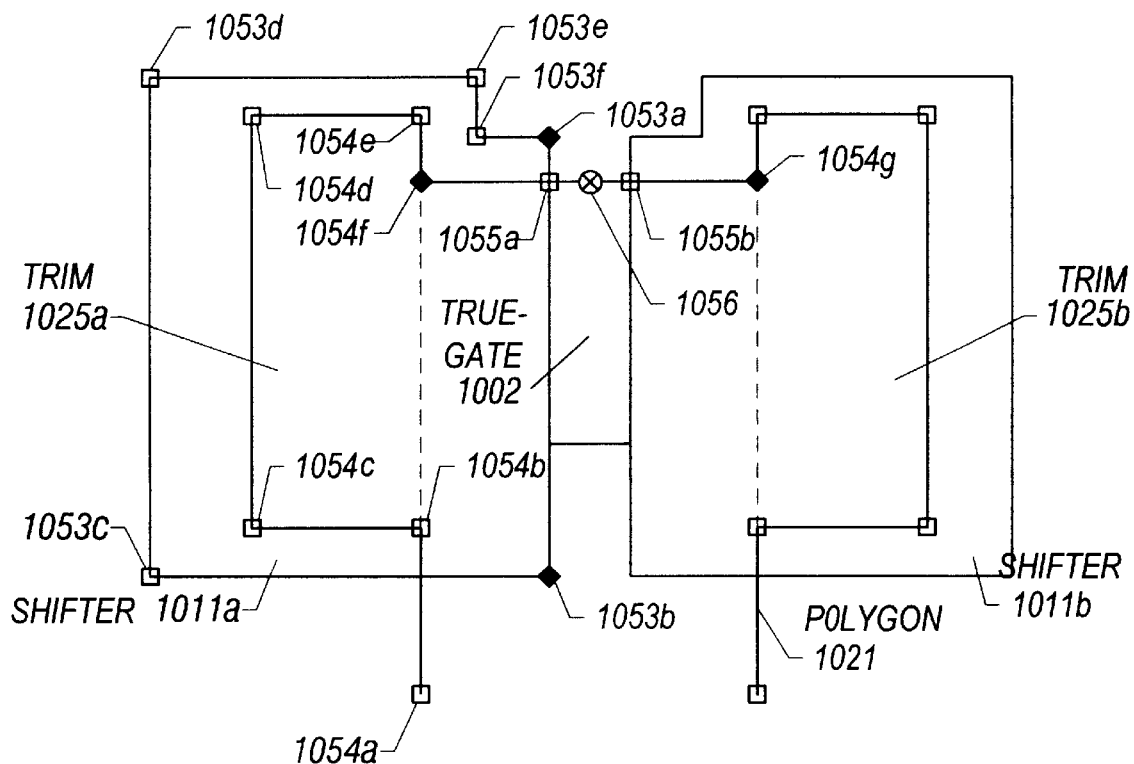

Other arrangements yield other results. For example, FIG. 10B shows an arrangement that has one edge of true-gate 1002 formed by a portion of one edge of polygon 1021, between vertices 1054f (of trim section 1025a) and 1054g (of trim section 1025b). The true gate corners on this edge are at points 1055a and 1055b. Both of these true-gate corners are also intersections of the shifters 1011 with this edge of the polygon 1021. Whether this edge is further dissected depends on the distance between these corners. If the distance from 1055a to 1055b is less than the minimum segment length, e.g., the lesser of Lcor and Ldet, then this edge of the polygon 1021, between vertices 1054f and 1054g, is not dissected; and no evaluation point is placed on this edge.

If the distance between true-gate corners 1055a and 1055b is greater than or equal to the minimum segment length, then the dissection of this edge of polygon 1021 connecting vertices 1054f to 1054g proceeds as follows. Normally true-gate corners 1055a and 1055b are dissection points and the evaluation point 1056 is midway between the two, as if the true-gate corners 1055a and 1055b were polygon vertices on a line-end. However, if both edge portions from true-gate corner to edge vertex, i.e. edge portion from vertex 1054f to true-gate corner 1055a and edge portion from true-gate corner 1055b to vertex 1054g, have lengths shorter than the minimum segment length, then the dissection points are moved to the vertices. The evaluation point 1056 remains unchanged, midway between the corners of the true-gate. If only one of these edge portions from true-gate corner to vertex is less than the minimum, the dissection point is moved to the vertex for the short edge portion. For example, if only the edge portion from vertex 1054f to true-gate corner 1055a has a length less than the minimum dissection length, then the dissection point is moved from 1055a to 1054f, while true-gate corner 1055b remains a dissection point. The evaluation point is moved so that it is placed two-thirds of the way from true-gate corner 1055a to 1055b.

These techniques illustrated with respect to FIG. 10B offer the advantages of producing no segments that are too short, and producing evaluation points at locations of physical significance even on edges of a polygon that are only partially printed.

Other edges of polygon 1021, such as those connecting vertices 1054b to 1054c, 1054c to 1054d, 1054d to 1054e, and 1054e to 1054f are inside shifter 1011a and are not printed. Also edges of shifters outside the trim, such as edges connecting vertices 1053c to 1053d, 1053d to 1053e, 1053e to 1053f, and 1053f to 1053a are not printed. Therefore these edges of polygon 1021 and shifter 1011 are not dissected. Still other edges, such as that edge of polygon 1021 connecting vertex 1054a to 1054b, are partially printed and are handled as described above with respect to FIG. 10A. The edge connecting vertices 1053a and 1053b of shifter 1011a form corners of the true-gate 1002 as described above with respect to FIG. 10A.

In order to print a true-gate area more aggressively, to ensure it will not be underexposed, a true-gate is often artificially extended. The amount that a true-gate is extended during design of a fabrication layout, such as a mask layout, can be specified by a designer with a true-gate extension length parameter Lext. In some instances, the designer may specify several true-gate extension length parameters for different circumstances. For example, a designer may specify a first true-gate extension for use where a true-gate is connected to another element and a second true-gate extension for use where a true-gate is capped by an end-cap.

The actual true-gate extension depends both on the parameters Lext and the actual feature geometries. For example, with respect to FIG. 10A, if the distance from true-gate corner 1032 to shifter vertex 1031 is less than Lext, then the true-gate 1001 is extended to the shifter vertex 1031. If, on the other hand, the distance from true-gate corner 1035 to shifter vertex 1036 is greater than Lext, then the true-gate is extended only to point 1039, a distance equal to Lext from the original true-gate corner 1036. According to this example, the true gate 1001 originally lying from point 1032 to point 1035 has been extended on both ends to lie from point 1031 to point 1039.

According to this embodiment, the dissection points are selected to be consistent with the true-gate extension scheme employed in the fabrication layout. For example, the dissection of an edge with a true gate described above is begun after the true-gate is extended to have corners at points 1031 and 1039.

Figure 10C:
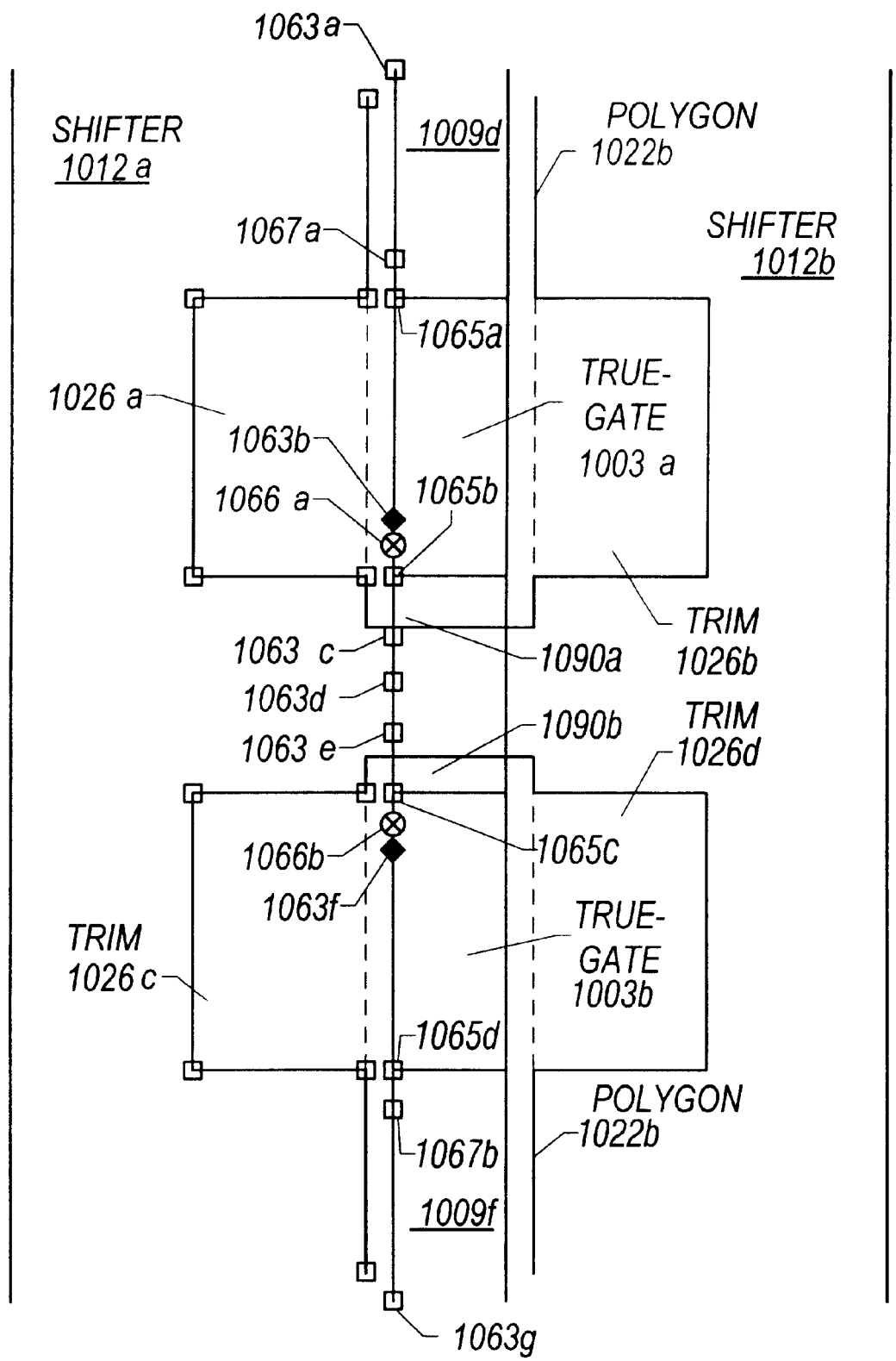

FIG. 10C shows shifters 1012 shared across two true-gates 1003 that are not connected to each other. For each true-gate, a polygon 1022 provides a connector 1009 to other elements, not shown, trim regions 1026, and an end cap 1090. For example, polygon 1022a provides connector 1009d, trim regions 1026a and 1026b, and end cap 1090a, whereas polygon 1022b provides connector 1009f, trim regions 1026c and 1026d, and end cap 1090b.

If Lext parameters have not been defined, then dissection proceeds as follows. Normally, dissection points are placed at the corners of the true-gate. For example, dissections points are placed at 1065a and 1065b for true-gate 1003a, and at 1065c and 1065d for true-gate 1003b. In addition, dissection points are placed a distance Lcor from the corner points of the true-gates. For example, a dissection point is placed at 1063b, a distance Lcor from true-gate corner 1065b, for true-gate 1003a. Similarly, a dissection point is placed at 1063f, a distance Lcor from true-gate corner 1065c, for true-gate 1003b. The evaluation point is placed two-thirds of the way along the resulting segment from the true-gate corner. For example, evaluation point 1066a is placed two-thirds of the way from true-gate corner 1065b to dissection point 1063b. Similarly, evaluation point 1066b is placed two-thirds of the way from true-gate corner 1065c to dissection point 1063f. No evaluation point is placed on the edge portion between the two true-gates, from point 1065b to point 1065c, because that edge is not printed and does not require correction.

However, if the distance between the true gates is less than the minimum segment length, e.g., the lesser of Lcor and Ldet, then the dissection points are moved to the middle point of the gap. For example, if the distance from true-gate corners 1065b of true-gate 1003a to true-gate corner 1065c of true-gate 1003b is less than the minimum of Lcor and Ldet, then the dissection points at 1065b and 1065c are both moved to point 1063d. The evaluation points are not moved. They remain as if the corners of the true-gate were vertices of the polygon.

If a Lext parameter has been defined, then dissection proceeds as follows. True-gate 1003a is extended to point 1063c, a distance Lext for end caps from the original true-gate corner at 1065b. Similarly, true-gate 1003b is extended to point 1063e, a distance Lext for end caps from the original true-gate corner at 1065c. No evaluation point is placed on the edge portion between the two true-gates, from point 1063c to point 1063e, because that edge is not printed and does not require correction. Similarly the other corners of the true-gates, 1065a and 1065d are moved outward a distance Lext for connectors to points 1067a and 1067b, respectively. In some embodiments, Lext for end caps is equal to Lext for connectors; in other embodiments they have different values. The evaluation points are placed two-thirds of the way from the extended corners 1063c and 1063e, respectively, to the dissection points 1063b and 1063f, respectively, each dissection point spaced a distance Lcor from the extended corners.

However, if the distance between the extended true-gates, from point 1063c to point 1063e, is less than the minimum dissection length, then the dissection points are not placed at 1063c and 1063e, but are both moved to the center point 1063d. The evaluation points are not moved.

The techniques described with respect to FIG. 10C have the advantage of defining segments each greater than the minimum segment length for all segments including edges of important features like true-gates. If the entire shared shifter edge is printed, these techniques are implemented during an alternative embodiment of step 330 of FIG. 3.

Functional Overview of Dissecting Doubly Exposed Edges

Figure 11:
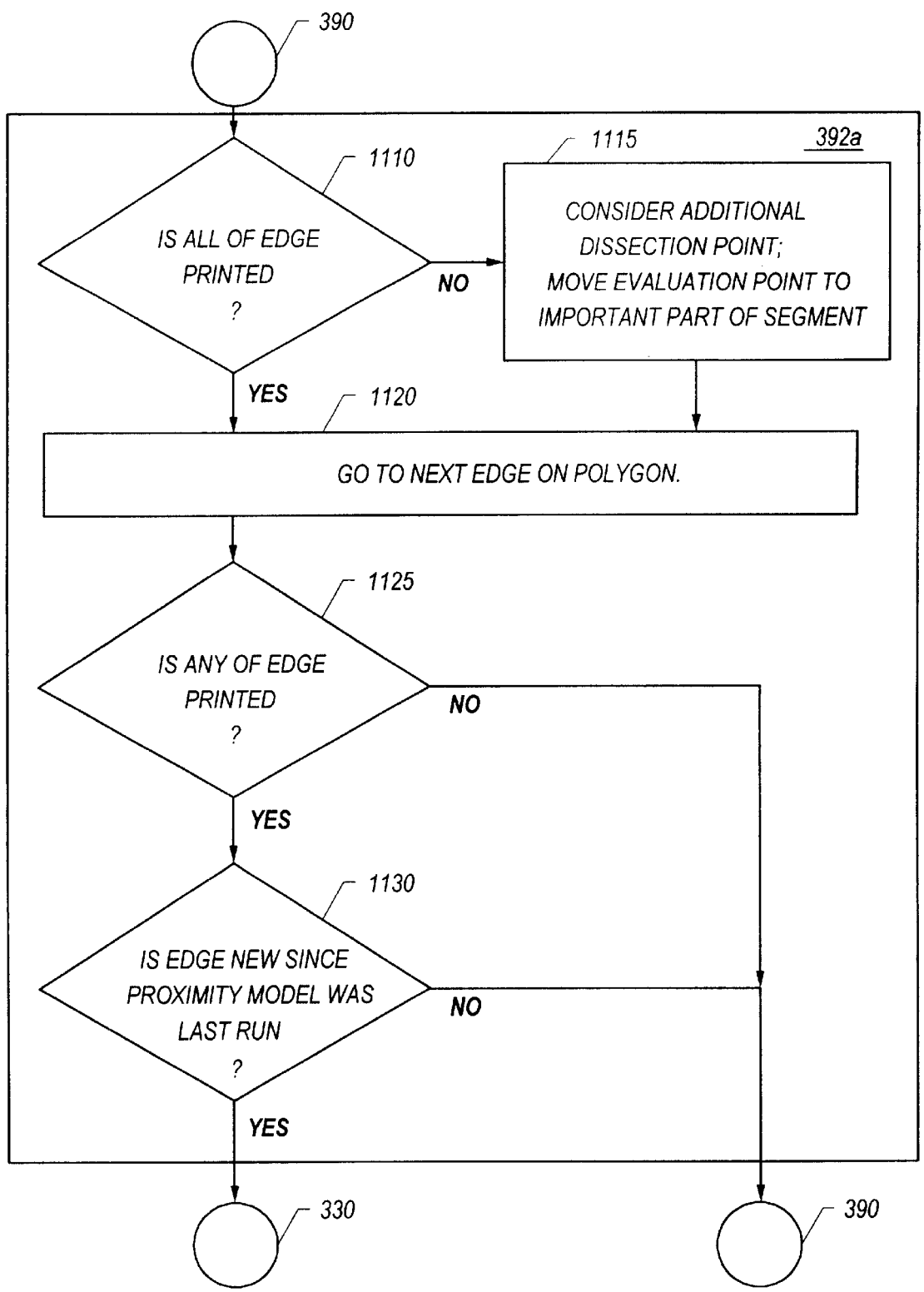
FIG. 11 is a flow diagram of a process employed when changing edges for selecting dissection points and evaluation points according to one embodiment.

FIG. 11 illustrates a method for finishing one edge and selecting another edge of a polygon that takes into account whether the edge or a portion of the edge is printed or not. These steps are included in an alternate embodiment 392a of step 392 shown in FIG. 3.

In step 1110 it is determined whether all of an edge is important for the edge on which dissection points and evaluation points were most recently selected. If all of the edge just completed is important, then control passes to step 1120 where the next edge on the polygon is made the current edge. If some of the edge is less important, such as because some of the edge is not a true-gate or some is not printed, then flow passes to step 1115 in which additional dissection points are considered, such as at intersections of polygon edges with shifter edges, and at corners of true gates. Evaluation points are only defined on important portions of segments. After these steps are performed, then flow passes to step 1120 to make the next edge the current edge.

In step 1125 it is determined whether any of the next edge is printed. If not, flow does not return to step 330 (of FIG. 3) to select dissection points. Instead, flow passes to step 390 of FIG. 3 to determine whether this is the last edge on the current polygon.

If at least some of the edge is printed, flow goes eventually to step 330 to select those dissection points on the next edge.

Computing Corrections for Evaluation Points

Once the dissection points and associated evaluation points are selected, the model is run for the actual layout only for the evaluation points, as shown by process 232 in FIG. 2. The resulting proximity effects model amplitude is used to compute a correction distance during process 234 of FIG. 2. The correction distance is then applied to the entire segment between dissection points, moving the segment out or in and creating a new polygon for an adjusted mask layout, as shown by process 236 in FIG. 2.

Iterative Use of Proximity Effects Model

Once the segments have been moved by the correction distance for all the affected polygons, the adjusted fabrication layout (produced by process 236 in FIG. 2) is completed. This is used as the final fabrication layout 235 in one embodiment. The corrections can be combined with the original polygons to create new flat files of polygons. In the preferred embodiment, a correction is stored as an hierarchical subunit in the hierarchical representation of the original polygon in the initial fabrication layout.

In another embodiment, the adjusted fabrication layout is tested again with the proximity effects model to determine whether the agreement between the printed features layer (249 in FIG. 2) and the design layout (225 in FIG. 2) satisfy a pre-defined specification tolerance. If so, the corrections end. Otherwise, another round of corrections is performed based on the current correction to further improve the agreement. This process iterates until the agreement converges on the specified tolerance for all edges, or it is determined that further improvement is not possible. In this embodiment, the recently adjusted fabrication layout produced during process 236 becomes the next proposed fabrication layout (231) and the processes 260 through 236 are repeated. For example, dissection points and evaluation points are selected for the new proposed layout, printed features are predicted with the model, and the differences are analyzed.

In one embodiment, only the new edges of the polygon generated by moving certain segments by the corresponding correction distances are dissected. In this embodiment, the halo used to find projection points is also reduced for the next round of evaluations, so that fewer corrections are attempted each round, and the solution can converge. This is accomplished, for example, as shown in FIG. 11. FIG. 11 shows step 1130, which determines whether the next edge to be processed is a new edge introduced since the last proximity effects model run. An edge will only be new if it includes a segment that was moved as a result of a correction. In step 1130, if the edge is not new, i.e., a segment was not moved, then the edge is skipped. Only new edges have dissection points and evaluation points selected in step 330 of FIG. 3.

Hardware Overview

Figure 12:
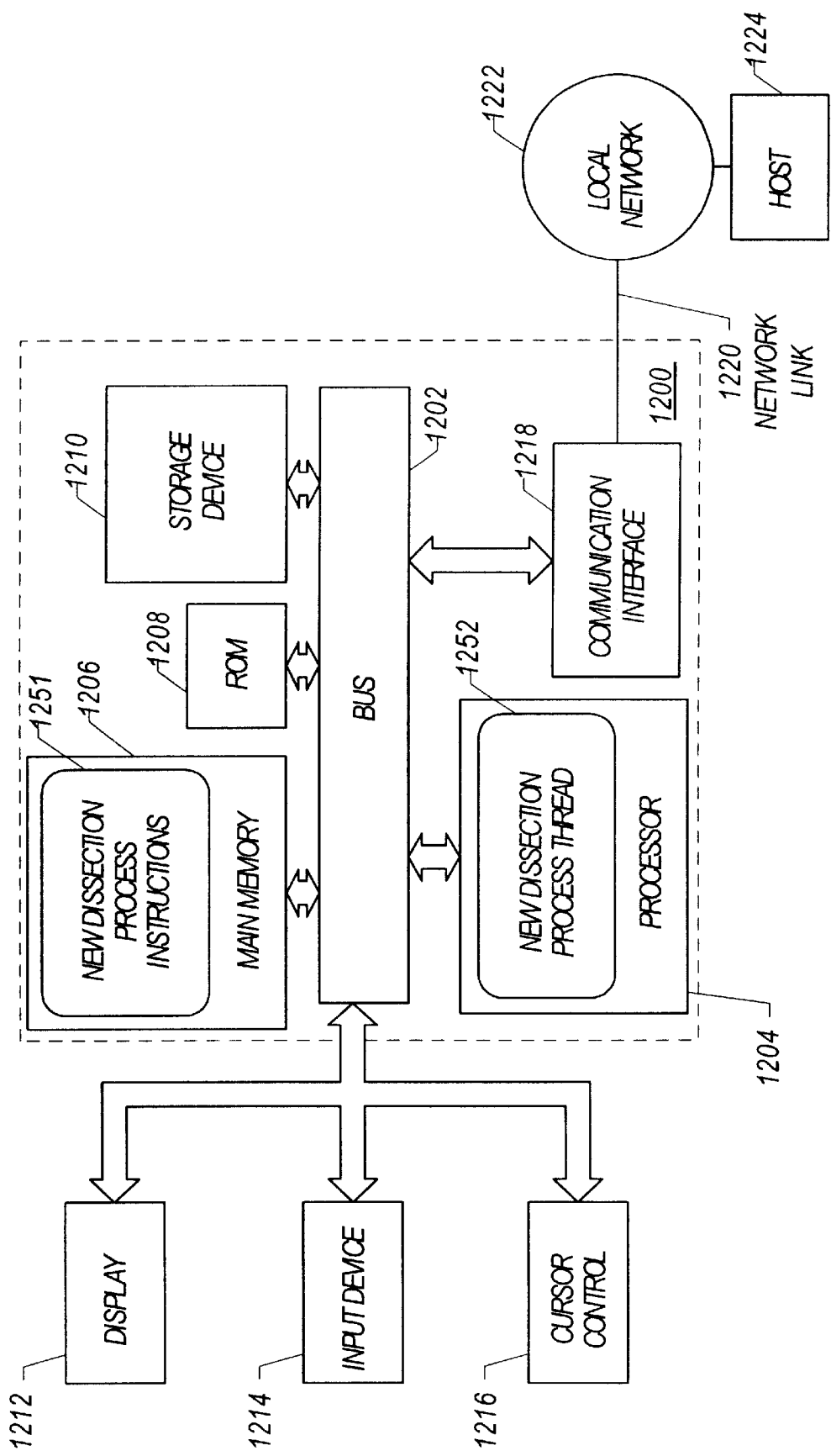
FIG. 12 is a block model of a computer system configured according to one embodiment.

FIG. 12 is a block diagram that illustrates a computer system 1200 upon which an embodiment of the invention is implemented. Computer system 1200 includes a bus 1202 or other communication mechanism for communicating information, and a processor 1204 coupled with bus 1202 for processing information. Computer system 1200 also includes a main memory 1206, such as a random access memory (RAM) or other dynamic storage device, coupled to bus 1202 for storing information and instructions to be executed by processor 1204. Main memory 1206 also may be used for storing temporary variables or other intermediate information during execution of instructions to be executed by processor 1204. Computer system 1200 further includes a read only memory (ROM) 1208 or other static storage device coupled to bus 1202 for storing static information and instructions for processor 1204. A storage device 1210, such as a magnetic disk or optical disk, is provided and coupled to bus 1202 for storing information and instructions.

Computer system 1200 may be coupled via bus 1202 to a display 1212, such as a cathode ray tube (CRT), for displaying information to a computer user. An input device 1214, including alphanumeric and other keys, is coupled to bus 1202 for communicating information and command selections to processor 1204. Another type of user input device is cursor control 1216, such as a mouse, a trackball, or cursor direction keys for communicating direction information and command selections to processor 1204 and for controlling cursor movement on display 1212. This input device typically has two degrees of freedom in two axes, a first axis (e.g., x) and a second axis (e.g., y), that allows the device to specify positions in a plane.

The invention is related to the use of computer system 1200 for producing design layouts and fabrication layouts. According to one embodiment of the invention, dissection points and evaluation points for fabrication layouts are provided by computer system 1200 in response to processor 1204 executing, e.g., as threads, one or more sequences of one or more instructions contained in main memory 1206. For example, the evaluation point determining process runs as a thread 1252 on processor 1204 based on evaluation point determining process instructions 1251 stored in main memory 1206. Such instructions maybe read into main memory 1206 from another computer-readable medium, such as storage device 1210. Execution of the sequences of instructions contained in main memory 1206 causes processor 1204 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1204 for execution. Such a medium may take many forms, including but not limited to, non-volatile media, volatile media, and transmission media. Non-volatile media includes, for example, optical or magnetic disks, such as storage device 1210. Volatile media includes dynamic memory, such as main memory 1206. Transmission media includes coaxial cables, copper wire and fiber optics, including the wires that comprise bus 1202. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1204 for execution. For example, the instructions may initially be carried on a magnetic disk of a remote computer. The remote computer can load the instructions into its dynamic memory and send the instructions over a telephone line using a modem. A modem local to computer system 1200 can receive the data on the telephone line and use an infra-red transmitter to convert the data to an infra-red signal. An infra-red detector can receive the data carried in the infra-red signal and appropriate circuitry can place the data on bus 1202. Bus 1202 carries the data to main memory 1206, from which processor 1204 retrieves and executes the instructions. The instructions received by main memory 1206 may optionally be stored on storage device 1210 either before or after execution by processor 1204.

Computer system 1200 also includes a communication interface 1218 coupled to bus 1202. Communication interface 1218 provides a two-way data communication coupling to a network link 1220 that is connected to a local network 1222. For example, communication interface 1218 may be an integrated services digital network (ISDN) card or a modem to provide a data communication connection to a corresponding type of telephone line. As another example, communication interface 1218 may be a local area network (LAN) card to provide a data communication connection to a compatible LAN. Wireless links may also be implemented. In any such implementation, communication interface 1218 sends and receives electrical, electromagnetic or optical signals that carry digital data streams representing various types of information.

Network link 1220 typically provides data communication through one or more networks to other data devices. For example, network link 1220 may provide a connection through local network 1222 to a host computer 1224. Local network 1222 uses electrical, electromagnetic or optical signals that carry digital data streams. The signals through the various networks and the signals on network link 1220 and through communication interface 1218, which carry the digital data to and from computer system 1200, are exemplary forms of carrier waves transporting the information.

Computer system 1200 can send messages and receive data, including program code, through the network(s), network link 1220 and communication interface 1218.

The received code may be executed by processor 1204 as it is received, and/or stored in storage device 1210, or other non-volatile storage for later execution. In this manner, computer system 1200 may obtain application code in the form of a carrier wave.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of correcting for proximity effects associated with an edge of a polygon in a layout, the method comprising:
    receiving a first target length (Lcor) for corner segments, a second target length (Ldet) for non-corner segments, and a plurality of characteristics of the edge including edge length L, line end, and turn end;
    determining whether the edge is a short edge using the plurality of characteristics, Lcor, and Ldet;
    using a first algorithm for providing dissection points and placing an evaluation point on the edge, if the edge is a short edge;
    using a second algorithm for dissecting the edge into segments, providing dissection points between the segments, and placing evaluation points on the segments, if the edge is longer than a short edge; and
    responsive to the providing and placing, correcting the edge for proximity effects.

2. The method of claim 1, wherein if L is less than a minimum dissection length, then providing no dissection points and no evaluation point.

3. The method of claim 2, wherein determining whether the edge is a short edge includes determining whether L is less than twice a minimum dissection length, the minimum dissection length being one of Lcor and Ldet.

4. The method of claim 3, wherein for a short edge providing dissection points and placing an evaluation point on the edge includes:
    selecting two vertices associated with the edge as dissection points; and
    placing the evaluation point at a point between the two dissection points.

5. The method of claim 4, further including determining whether the edge is a long edge using the plurality of characteristics, Lcor, and Ldet.

6. The method of claim 5, wherein determining whether the edge is a long edge includes determining whether L is at least a sum of Ldet and 2×Lcor.

7. The method of claim 6, wherein, for an edge longer than a short edge but shorter than a long edge, determining whether the edge has an associated convex vertex and an associated concave vertex.

8. The method of claim 7, wherein if the edge does not have associated convex and concave vertices, then
    selecting two vertices associated with the edge as dissection points; and
    placing the evaluation point at a point between the two dissection points.

9. The method of claim 7, wherein if the edge has associated convex and concave vertices, then determining whether L is less than 2×Ldet.

10. The method of claim 9, wherein if L is less than 2×Ldet, then
    selecting two vertices associated with the edge as dissection points; and
    placing the evaluation point at a point between the two dissection points.

11. The method of claim 9, wherein it L is not less than 2×Ldet, then
    selecting two vertices associated with the edge and a midpoint of the edge as dissection points, thereby forming two segments; and
    placing evaluation points on the two segments.

12. The method of claim 6, wherein if the edge is a long edge, then
    selecting points having Lcor spacing from associated vertices of the edge as well as the associated vertices as dissection points, thereby creating two corner segments and one residual segment.

13. The method of claim 12, further including:
    identifying any projection points on the residual segment; and
    selecting any projection point having at least Ldet spacing to another projection point as a dissection point.

14. The method of claim 13, further including, for each pair of dissection points not defining a corner segment:
    computing a residual length Lr between the pair of dissection points; and
    determining whether Lr is more than 2×Ldet.

15. The method of claim 14, wherein if Lr is not more than 2×Ldet, then proceeding to the next pair of dissection points not defining a corner segment, if present.

16. The method of claim 15, wherein if Lr is more than 2×Ldet, then determining whether Lr is at least 3×Ldet.

17. The method of claim 16, wherein if Lr is less than than 3×Ldet, then selecting a midpoint on Lr as a dissection point.

18. The method of claim 16, wherein if Lr is at least 3×Ldet, then selecting points having Ldet spacing from the pair of dissection points not defining a corner segment as new dissection points, thereby creating a new residual segment defined by the new dissection points.

19. The method of claim 18, further including:
    receiving a third target length Lmax, which is a maximum dissection length for any segment formed from the new residual segment;
    computing Lr/Lmax, thereby generating a ceiling integer N;
    computing Lr/N, thereby generating an effective length dmax for a segment formed from the new residual length segment; and
    selecting N−1 dissection points on the new residual length segment, wherein such dissection points have a spacing of dmax.

20. A method of using a computer to correct for proximity effects associated with an edge of a polygon in a design layout, the computer having a processor coupled to a computer-readable medium, the computer-readable medium storing at least a portion of the design layout, the design layout corresponding to a portion of an integrated circuit, the method comprising:
    receiving a first target length (Lcor) for corner segments, a second target length (Ldet) for non-corner segments, and a plurality of characteristics of the edge including edge length L, line end, and turn end;
    determining whether the edge is a short edge using the plurality of characteristics, Lcor and Ldet;

using a first algorithm for providing dissection points and placing an evaluation point on the edge, if the edge is a short edge;

using a second algorithm for dissecting the edge into segments, providing dissection points between segments, and placing evaluation points on the segments, if the edge is longer than a short edge; and responsive to the dissecting and placing, correcting the edge for proximity effects.

21. The method of claim 20, wherein if L is less than a minimum dissection length, then providing no dissection points and no evaluation point.

22. The method of claim 21, wherein determining whether the edge is a short edge includes determining whether L is less than twice a minimum dissection length, the minimum dissection length being one of Lcor and Ldet.

23. The method of claim 22, wherein for a short edge providing dissection points and placing an evaluation point on the edge includes:

selecting two vertices associated with the edge as dissection points; and placing the evaluation point at a point between the two dissection points.

24. The method of claim 23, further including determining whether the edge is a long edge using the plurality of characteristics, Lcor, and Ldet.

25. The method of claim 24, wherein determining whether the edge is a long edge includes determining whether L is at least a sum of Ldet and 2×Lcor.

26. The method of claim 25, wherein, for an edge longer than a short edge but shorter than a long edge, determining whether the edge has an associated convex vertex and an associated concave vertex.

27. The method of claim 26, wherein if the edge does not have associated convex and concave vertices, then selecting two vertices associated with the edge as dissection points; and placing the evaluation point at a point between the two dissection points.

28. The method of claim 26, wherein if the edge has associated convex and concave vertices, then determining whether L is less than 2×Ldet.

29. The method of claim 28, wherein if L is less than 2×Ldet, then selecting two vertices associated with the edge as dissection points; and placing the evaluation point at a point between the two dissection points.

30. The method of claim 28, wherein if L is not less than 2×Ldet, then selecting two vertices associated with the edge and a midpoint of the edge as dissection points, thereby forming two segments; and placing evaluation points on the two segments.

31. The method of claim 25, wherein if the edge is a long edge, then selecting points having Lcor spacing from associated vertices of the edge as well as the associated vertices as dissection points, thereby creating two corner segments and one residual length segment.

32. The method of claim 31, further including:

identifying any projection points on the residual length segment; and selecting any projection point having at least Ldet spacing to another projection point as a dissection point.

33. The method of claim 32, further including, for each pair of dissection points not defining a corner segment:

computing a residual length Lr between the pair of dissection points; and determining whether Lr is more than 2×Ldet.

34. The method of claim 33, wherein if Lr is not more than 2×Ldet, then proceeding to the next pair of dissection points not defining a corner segment, if present.

35. The method of claim 34, wherein if Lr is more than 2×Ldet, then determining whether Lr is at least 3×Ldet.

36. The method of claim 35, wherein if Lr is less than than 3×Ldet, then selecting a midpoint on Lr as a dissection point.

37. The method of claim 35, wherein if Lr is at least 3×Ldet, then selecting points having Ldet spacing from the pair of dissection points not defining a corner segment as new dissection points, thereby creating a new residual length segment defined by the new dissection points.

38. The method of claim 37, further including:

receiving a third target length Lmax, which is a maximum dissection length for any segment formed from the new residual length segment;

computing Lr/Lmax, thereby generating a ceiling integer N;

computing Lr/N, thereby generating an effective length dmax for a segment formed from the new residual length segment; and selecting N−1 dissection points on the new residual length segment, wherein such dissection points have a spacing of dmax.

39. A computer readable medium for correcting proximity effects associated with an edge of a polygon in a layout, the computer readable medium carrying instructions to cause one or more processors to perform:

receiving a first target length (Lcor) for corner segments, a second target length (Ldet) for non-corner segments, and a plurality of characteristics of the edge including edge length L, line end, and turn end;

determining whether the edge is a short edge using the plurality of characteristics, Lcor, and Ldet;

using a first algorithm for providing dissection points and placing an evaluation point on the edge, if the edge is a short: edge;

using a second algorithm for dissecting the edge into segments, providing dissection points between the segments, and placing evaluation points on the segments, if the edge is longer than a short edge; and responsive to the providing and placing, correcting the edge for proximity effects.

40. A carrier wave for correcting proximity effects associated with an edge of a polygon in a layout, the carrier wave carrying instructions to cause one or more processors to perform:

receiving a first target length (Lcor) for corner segments, a second target length (Ldet) for non-corner segments, and a plurality of characteristics of the edge including edge length L, line end, and turn end;

determining whether the edge is a short edge using the plurality of characteristics, Lcor, and Ldet;

using a first algorithm for providing dissection points and placing an evaluation point on the edge, if the edge is a short edge;

using a second algorithm for dissecting the edge into segments, providing dissection points between the segments, and placing evaluation points on the segments, if the edge is longer than a short edge; and responsive to the providing and placing, correcting the edge for proximity effects.

* * * * *